(12) United States Patent
Chen et al.

(10) Patent No.: US 11,721,541 B2
(45) Date of Patent: Aug. 8, 2023

(54) SEMICONDUCTOR ARRANGEMENT FORMATION

(71) Applicant: TAIWAN SEMICONDUCTOR MANUFACTURING COMPANY LIMITED, Hsin-Chu (TW)

(72) Inventors: Ting-Jui Chen, Hsinchu (TW); Chen Chih-Fen, Taoyuan (TW); Jason Yu, Hsinchu (TW); Tung-Hsi Hsieh, Hsinchu (TW); Jiang-He Xie, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 233 days.

(21) Appl. No.: 17/190,577

(22) Filed: Mar. 3, 2021

(65) Prior Publication Data
US 2022/0285148 A1 Sep. 8, 2022

(51) Int. Cl.
| H01L 21/02 | (2006.01) |
| H01L 21/762 | (2006.01) |
| H01L 21/027 | (2006.01) |
| H01L 21/22 | (2006.01) |

(52) U.S. Cl.
CPC .... *H01L 21/02057* (2013.01); *H01L 21/0273* (2013.01); *H01L 21/22* (2013.01); *H01L 21/76224* (2013.01)

(58) Field of Classification Search
CPC .......... H01L 21/02057; H01L 21/0273; H01L 21/22; H01L 21/76224; H01L 21/0209; H01L 21/02301; H01L 21/02661; G03F 7/42

See application file for complete search history.

(56) References Cited

U.S. PATENT DOCUMENTS

| 6,033,973 | A | * | 3/2000 | Takemura | H01L 29/66757 118/716 |
| 2006/0286783 | A1 | * | 12/2006 | Papanu | H01L 21/02057 438/510 |
| 2009/0042388 | A1 | * | 2/2009 | Sun | H01L 21/02063 438/689 |
| 2009/0229638 | A1 | | 9/2009 | Yun et al. | |
| 2010/0190098 | A1 | * | 7/2010 | Walker | G03F 7/427 430/30 |
| 2015/0357202 | A1 | | 12/2015 | Thedjoisworo et al. | |
| 2016/0086864 | A1 | * | 3/2016 | Fischer | H01L 21/67051 156/345.24 |
| 2018/0076049 | A1 | | 3/2018 | Lee et al. | |

FOREIGN PATENT DOCUMENTS

| TW | 202029304 A | 8/2020 |
| WO | 2020223011 A1 | 11/2020 |

* cited by examiner

*Primary Examiner* — Julia Slutsker
(74) *Attorney, Agent, or Firm* — Cooper Legal Group, LLC

(57) ABSTRACT

A method for forming a semiconductor arrangement is provided. The method includes forming a patterned photoresist over a top surface of a substrate. The method includes doping a first portion of the substrate using the patterned photoresist. The method includes removing the patterned photoresist using a gas comprising fluoride, wherein fluoride residue from the gas remains on the top surface of the substrate after removing the patterned photoresist. The method includes treating the substrate with nitrous oxide to remove the fluoride residue.

20 Claims, 25 Drawing Sheets

SEMICONDUCTOR ARRANGEMENT FORMATION

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
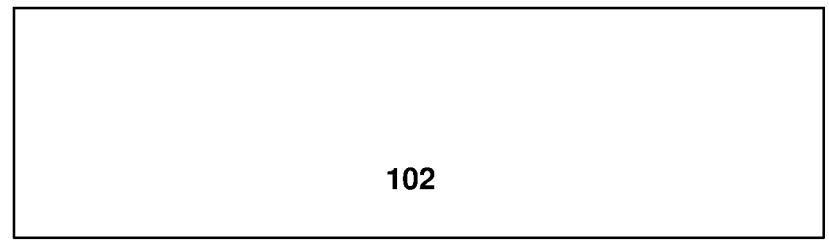
FIGS. 1-18 illustrate cross-sectional views of a semiconductor arrangement at various stages of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

Some embodiments relate to a method for forming a semiconductor arrangement. In accordance with some embodiments, a patterned photoresist is removed from a top surface of a substrate using a gas comprising fluoride. Fluoride residue from the gas remains on the top surface of the substrate after removing the patterned photoresist. The substrate is treated with a treating material, such as at least one of nitrous oxide or other suitable material, to remove the fluoride residue. A first dielectric layer is formed over the substrate after treating the substrate with the treating material. Treating the substrate with the treating material prior to forming the first dielectric layer reduces a number fluoride ions at an interface between the first dielectric layer and the substrate as compared with some semiconductor arrangements formed without treating the substrate prior to forming the first dielectric layer over the substrate. Treating the substrate with the treating material prior to forming the first dielectric layer increases in an amount of radiation that is at least one of sensed, detected, or converted to electrons by the semiconductor arrangement, as compared with some semiconductor arrangements formed without treating the substrate prior to forming the first dielectric layer over the substrate. In some embodiments, the semiconductor arrangement comprises an optical element. In some embodiments, the semiconductor arrangement operates as a sensor, such as at least one of an optical sensor, an image sensor, a proximity sensor, or other type of sensor. Given the increase in the amount of radiation that is at least one of sensed, detected, or converted to electrons, the semiconductor arrangement operates more efficiently than other optical elements and/or sensors, such as requiring less power, being more effective in a relatively low light situation, providing a higher resolution, etc.

FIGS. 1-18 are cross-sectional views of a semiconductor arrangement 100, in accordance with some embodiments. In some embodiments, at least one of an optical element, a sensor, or a photodiode is implemented via the semiconductor arrangement 100. The sensor comprises at least one of an optical sensor, an image sensor, a proximity sensor, a time of flight (ToF) sensor, an indirect ToF (iToF) sensor, a complementary metal-oxide-semiconductor (CMOS) image sensor, or other type of sensor. Other structures and configurations of the semiconductor arrangement 100 and the sensor are within the scope of the present disclosure.

FIG. 1 illustrates the semiconductor arrangement 100 according to some embodiments. The semiconductor arrangement 100 comprises a substrate 102. The substrate 102 comprises at least one of an epitaxial layer, a silicon-on-insulator (SOI) structure, a wafer, or a die formed from a wafer. The substrate 102 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP or other suitable material. According to some embodiments, the substrate 102 comprises monocrystalline silicon, crystalline silicon with a <100> crystallographic orientation, crystalline silicon with a <110> crystallographic orientation or other suitable material. In some embodiments, the substrate 102 is a p-type semiconductor substrate (P-substrate). In some embodiments, the substrate 102 is an n-type semiconductor substrate (N-substrate). Other structures and configurations of the substrate 102 are within the scope of the present disclosure.

Figure 2:
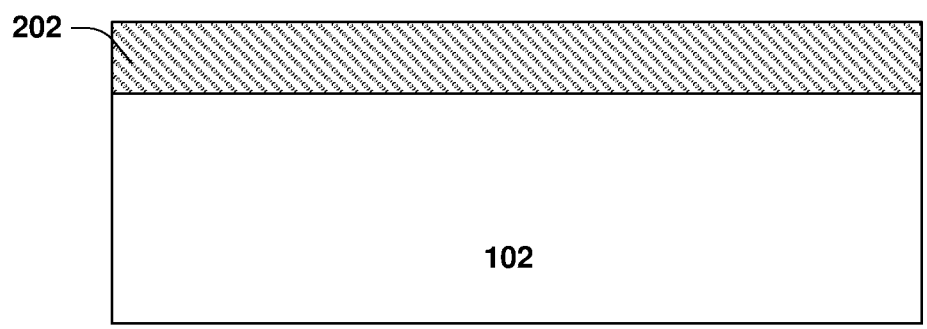

FIG. 2 illustrates a first photoresist 202 formed over the substrate 102, according to some embodiments. The first photoresist 202 at least one of overlies the substrate 102, is in direct contact with a top surface of the substrate 102, or is in indirect contact with the top surface of the substrate 102. The first photoresist 202 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques.

The first photoresist 202 comprises a light-sensitive material, where properties, such as solubility, of the first photoresist 202 are affected by light. The first photoresist 202 is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist.

Figure 3:
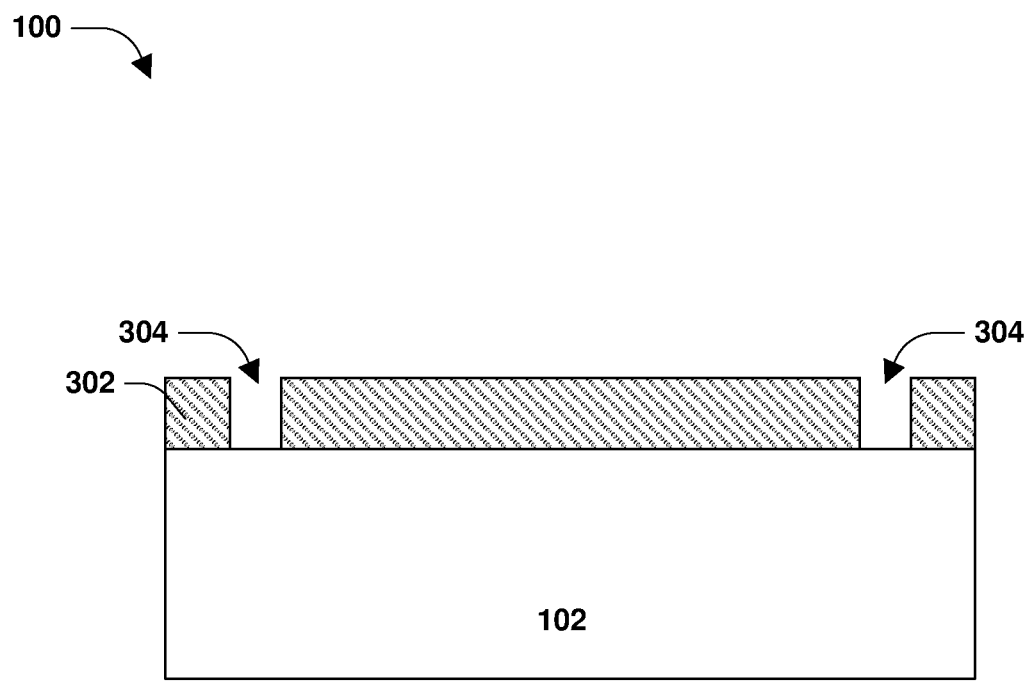

FIG. 3 illustrates a first patterned photoresist 302 formed from the first photoresist 202, according to some embodiments. The first patterned photoresist 302 defines first openings 304 exposing portions of the substrate 102. Even though two openings of the first openings 304 of the first patterned photoresist 302 are depicted, any number of openings in the first openings 304 are contemplated.

Figure 4:
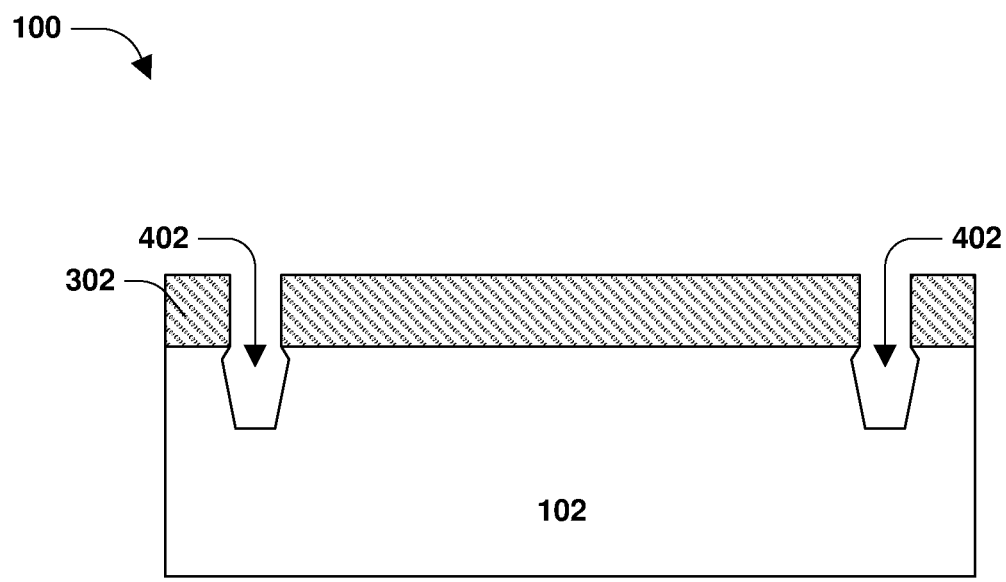

FIG. 4 illustrates use of the first patterned photoresist 302 to form trenches 402 in the substrate 102, according to some embodiments. Even though two trenches 402 in the substrate 102 are depicted, any number of trenches 402 are contemplated. In some embodiments, an etching process is performed to form the trenches 402, where the first openings 304 in the first patterned photoresist 302 allow one or more etchants applied during the etching process to remove portions of the substrate 102 while the first patterned photoresist 302 protects or shields portions of the substrate 102 that are covered by the first patterned photoresist 302. The etching process is at least one of a dry etching process, a wet etching process, an anisotropic etching process, an isotropic etching process, or other suitable process. The etching process uses at least one of hydrogen fluoride (HF), diluted HF, a chlorine compound such as hydrogen chloride ($HCl_2$), hydrogen sulfide ($H_2S$), tetrafluoromethane ($CF_4$), or other suitable material. Other processes and techniques for forming the trenches 402 are within the scope of the present disclosure.

Figure 5:
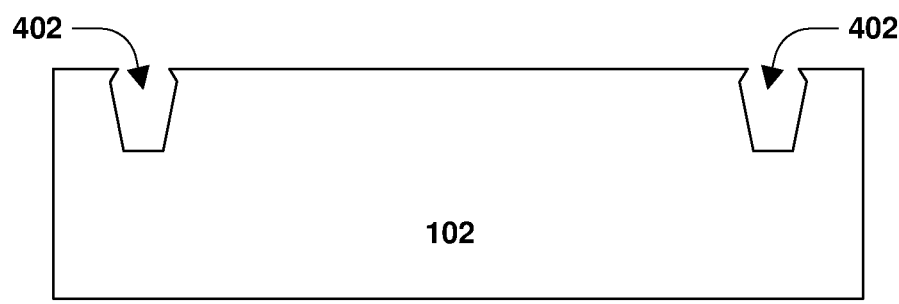

FIG. 5 illustrates removal of the first patterned photoresist 302, according to some embodiments. The first patterned photoresist 302 is removed after the trenches 402 are formed. The first patterned photoresist 302 is removed by at least one of chemical mechanical planarization (CMP), a washing process, or other suitable techniques. In some embodiments, the first patterned photoresist 302 is removed using a gas comprising fluoride, such as at least one of HF, diluted HF, $CF_4$, or other gas comprising fluoride. In some embodiments, first fluoride residue from the gas, such as cryptohalite (($NH_4)_2SiF_6$) or other residual material comprising fluoride, remains on the top surface of the substrate 102 after removing the first patterned photoresist 302. In some embodiments, first polymer residue from at least one of the first photoresist 202 or the first patterned photoresist 302 remains on the top surface of the substrate 102 after removing the first patterned photoresist 302.

Figure 6:
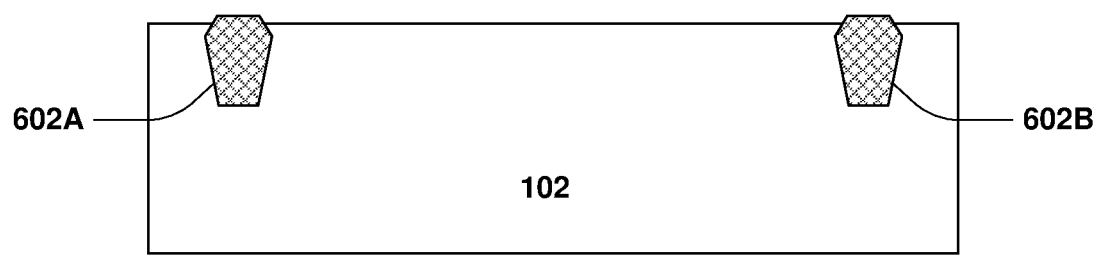

FIG. 6 illustrates isolation structures 602 formed in the trenches 402, according to some embodiments. Even though two isolation structures 602 are depicted, any number of isolation structures 602 are contemplated. In some embodiments, the isolation structures 602 comprise at least one of a first isolation structure 602A or a second isolation structure 602B. In some embodiments, the isolations structures 602 are shallow trench isolation (STI) regions. The isolation structures 602 comprise a dielectric material or other suitable material. In some embodiments, the isolation structures 602 comprise at least one of silicon, oxide, nitride, such as silicon nitride, or other suitable material. The isolation structures 602 are formed by at least one of PVD, sputtering, CVD, LPCVD, ALCVD, UHVCVD, RPCVD, ALD, MBE, LPE, spin on, growth, or other suitable techniques.

The isolation structures 602 are formed at least partially within the substrate 102. In some embodiments, a top surface of an isolation structure 602 is above the top surface of the substrate 102. In some embodiments, a top surface of an isolation structure 602 and the top surface of the substrate 102 are substantially coplanar. In some embodiments, the top surface of the substrate 102 is above a top surface of an isolation structure 602. Sidewalls of an isolation structure 602 are at least one of in direct contact with sidewalls of the substrate 102 defining the trenches 402 or in indirect contact with sidewalls of the substrate 102 defining the trenches 402.

Figure 7:
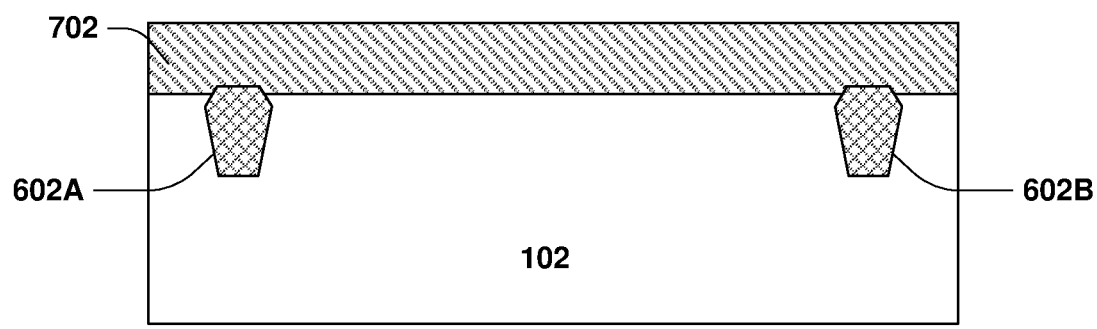

FIG. 7 illustrates a second photoresist 702 formed over at least one of the substrate 102 or the isolation structures 602, according to some embodiments. The second photoresist 702 at least one of overlies the substrate 102, is in direct contact with the top surface of the substrate 102, or is in indirect contact with the top surface of the substrate 102. The second photoresist 702 at least one of overlies the isolation structures 602, is in direct contact with a top surface of an isolation structure 602, or is in indirect contact with a top surface of an isolation structure 602. The second photoresist 702 is formed by at least one of PVD, sputtering, CVD, LPCVD, ALCVD, UHVCVD, RPCVD, ALD, MBE, LPE, spin on, growth, or other suitable techniques.

Figure 8:
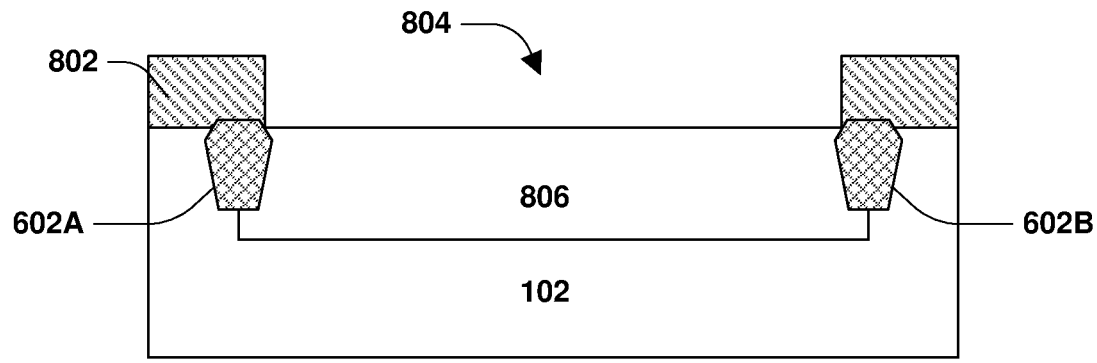

FIG. 8 illustrates a second patterned photoresist 802 formed from the second photoresist 702, according to some embodiments. The second patterned photoresist 802 defines a second opening 804 exposing a portion of the substrate 102. In some embodiments, the second opening 804 is between the isolation structures 602, such that the second opening 804 does not overlie or is laterally offset from the isolation structures 602. In some embodiments, the second opening 804 overlies at least some of an isolation structure of the isolation structures 602.

Figure 9:
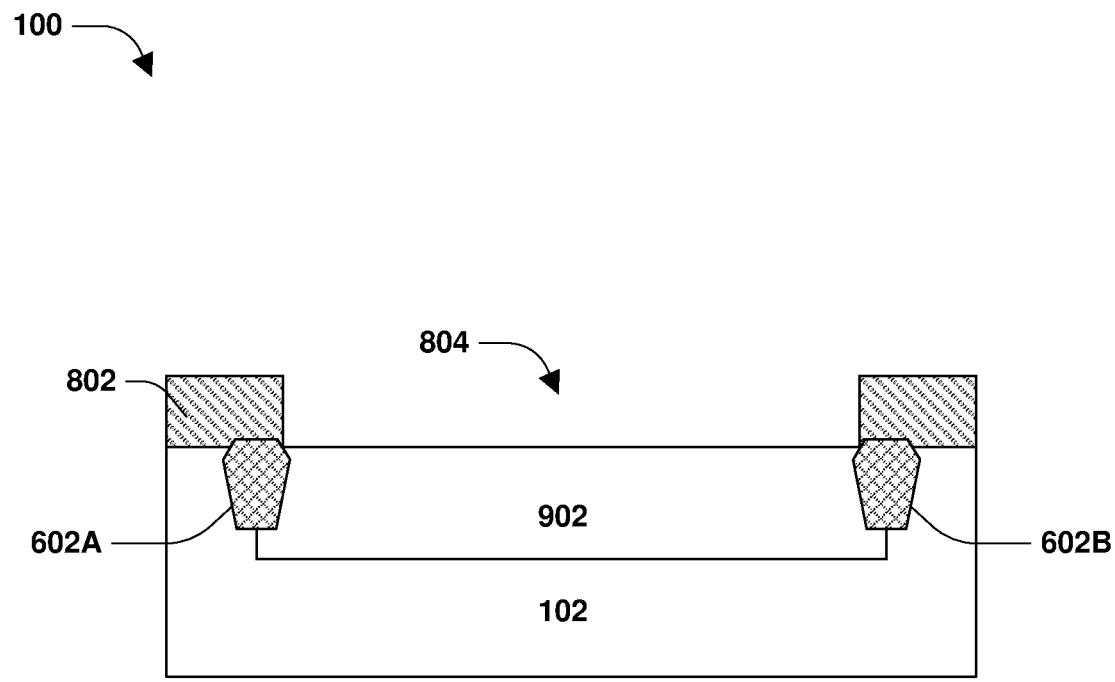

FIG. 9 illustrates use of the second patterned photoresist 802 to dope a first portion 806 of the substrate 102 (shown in FIG. 8) to form a first doped region 902, according to some embodiments. In some embodiments, at least some of the first doped region 902 is between the isolation structures 602. In some embodiments, a portion of the first doped region 902 is under an isolation structure 602. In some embodiments, a portion of the first doped region 902 underlies an isolation structure 602. The first portion 806 of the substrate 102 is doped to form the first doped region 902 by at least one of ion implantation, molecular diffusion, or other suitable techniques. In some embodiments, a depth of dopants in the substrate 102 is controlled by increasing or decreasing a voltage used to direct the dopants into the substrate 102. Other processes and techniques for at least one of doping the first portion 806 of the substrate 102 or forming the first doped region 902 are within the scope of the present disclosure. In some embodiments, the first doped region 902 has a gradient such that a concentration of dopants changes, such as increases or decreases, as the first doped region 902 extends into the substrate 102. In some embodiments, the first doped region 902 comprises n-type dopants. In some embodiments, the first doped region 902 is an n-well. In some embodiments, the first doped region 902 comprises p-type dopants. In some embodiments, the first doped region 902 is a p-well. Other configurations of the first doped region 902 are within the scope of the present disclosure.

Figure 10:
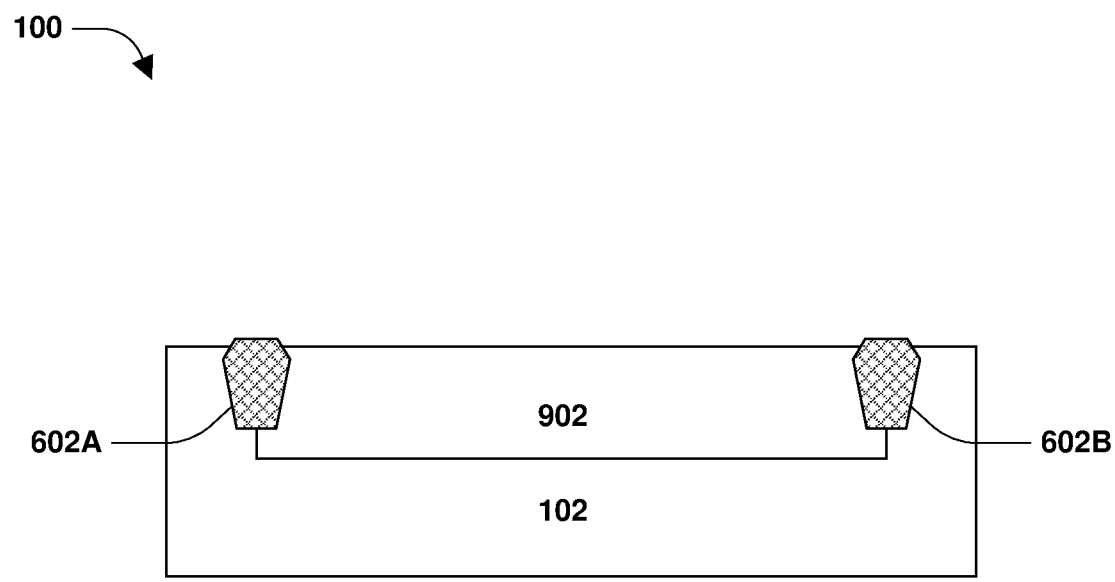

FIG. 10 illustrates removal of the second patterned photoresist 802, according to some embodiments. The second patterned photoresist 802 is removed after the first portion 806 of the substrate 102 is doped to form the first doped region 902. The second patterned photoresist 802 is removed by at least one of CMP, a washing process, or other suitable techniques. In some embodiments, the second patterned photoresist 802 is removed using a gas comprising fluoride, such as at least one of HF, diluted HF, $CF_4$, or other gas comprising fluoride. In some embodiments, second fluoride residue from the gas, such as $(NH_4)_2SiF_6$ or other residual material comprising fluoride, remains on the top surface of the substrate 102 after removing the second patterned photoresist 802. In some embodiments, second polymer residue from at least one of the second photoresist 702 or the second patterned photoresist 802 remains on the top surface of the substrate 102 after removing the second patterned photoresist 802.

Figure 11:
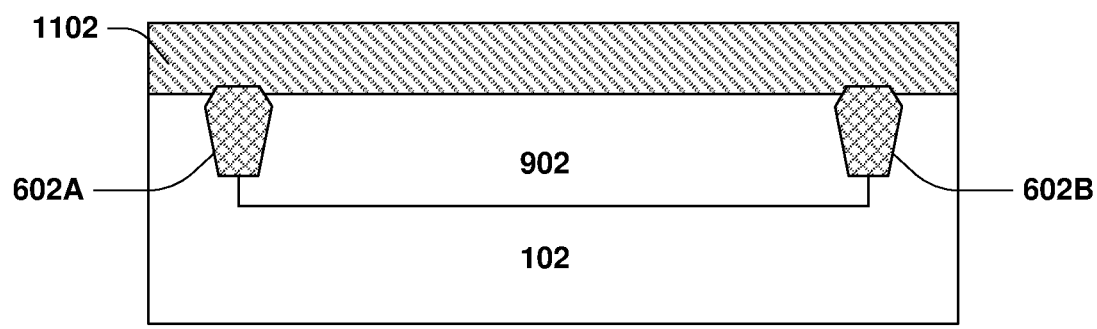

FIG. 11 illustrates a third photoresist 1102 formed over at least one of the substrate 102 or the isolation structures 602, according to some embodiments. The third photoresist 1102 at least one of overlies the substrate 102, is in direct contact with the top surface of the substrate 102, or is in indirect contact with the top surface of the substrate 102. The third photoresist 1102 at least one of overlies the isolation structures 602, is in direct contact with a top surface of an isolation structure 602, or is in indirect contact with a top surface of an isolation structure 602. The third photoresist 1102 is formed by at least one of PVD, sputtering, CVD, LPCVD, ALCVD, UHVCVD, RPCVD, ALD, MBE, LPE, spin on, growth, or other suitable techniques.

Figure 12:
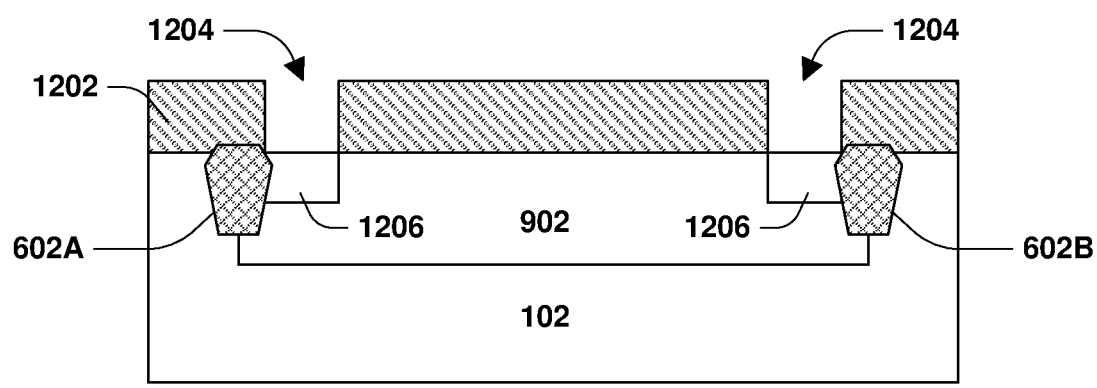

FIG. 12 illustrates a third patterned photoresist 1202 formed from the third photoresist 1102, according to some embodiments. The third patterned photoresist 1202 defines third openings 1204 exposing portions of the substrate 102. Even though two openings of the third openings 1204 of the third patterned photoresist 1202 are depicted, any number of openings of the third openings 1204 are contemplated. In some embodiments, the third openings 1204 are between the isolation structures 602, such that the third openings 1204 do not overlie or are laterally offset from the isolation structures 602. In some embodiments, the third openings 1204 overlie at least some of the isolation structures 602.

Figure 13:
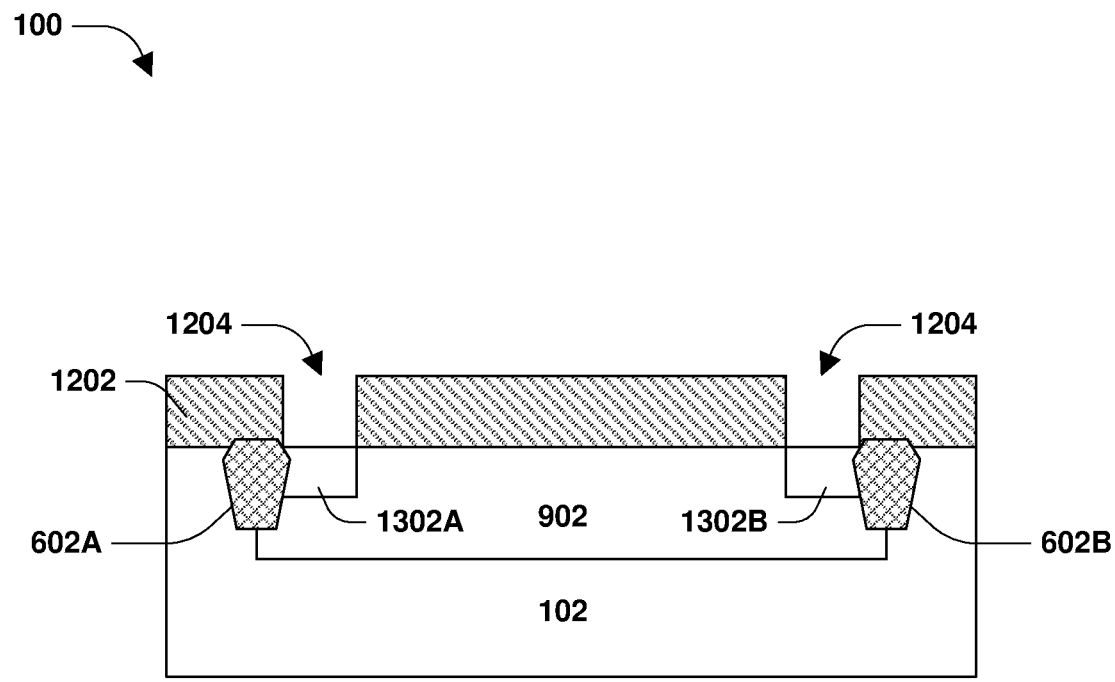

FIG. 13 illustrates use of the third patterned photoresist 1202 to dope one or more second portions 1206 of the substrate 102 (shown in FIG. 12) to form one or more second doped regions 1302, according to some embodiments. In some embodiments, the one or more second doped regions 1302 comprise at least one of a doped region 1302A or a doped region 1302B. In some embodiments, at least some of a doped region of the one or more second doped regions 1302 is between the isolation structures 602. The one or more second portions 1206 of the substrate 102 are doped to form the one or more second doped regions 1302 by at least one of ion implantation, molecular diffusion, or other suitable techniques. In some embodiments, a depth of dopants in the substrate 102 is controlled by increasing or decreasing a voltage used to direct the dopants into the substrate 102. Other processes and techniques for at least one of doping the one or more second portions 1206 of the substrate 102 or forming the one or more second doped regions 1302 are within the scope of the present disclosure. In some embodiments, the one or more second doped regions 1302 have a gradient such that a concentration of dopants changes, such as increases or decreases, as the one or more second doped regions 1302 extend into the substrate 102. In some embodiments, the one or more second doped regions 1302 comprise n-type dopants. In some embodiments, the one or more second doped regions 1302 comprise p-type dopants. Other configurations of the one or more second doped regions 1302 are within the scope of the present disclosure.

Figure 14:
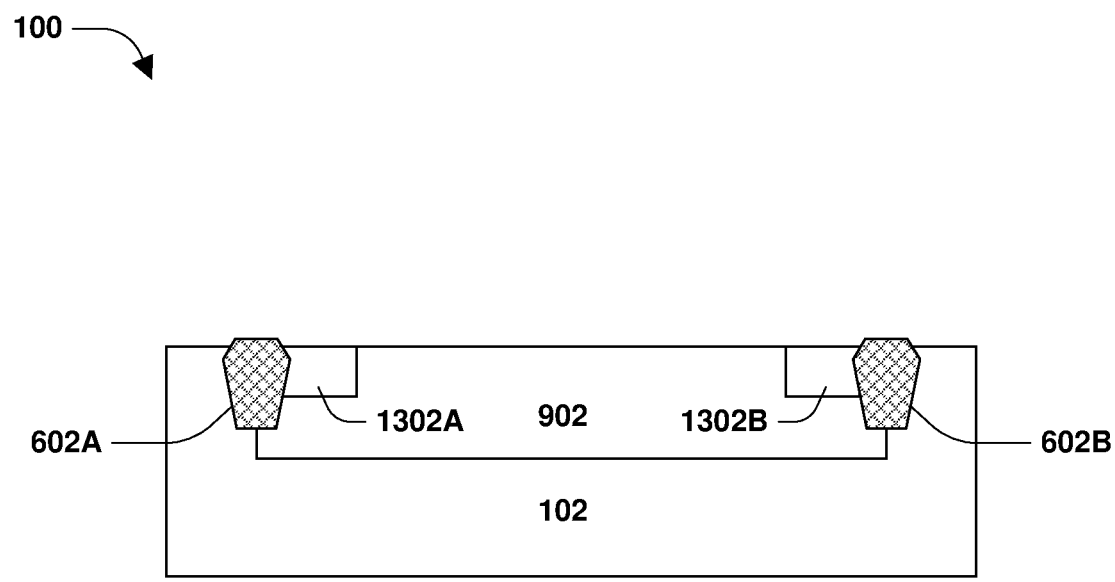

FIG. 14 illustrates removal of the third patterned photoresist 1202, according to some embodiments. The third patterned photoresist 1202 is removed after the one or more second portions 1206 of the substrate 102 are doped to form the one or more second doped regions 1302. The third patterned photoresist 1202 is removed by at least one of CMP, a washing process, or other suitable techniques. In some embodiments, the third patterned photoresist 1202 is removed using a gas comprising fluoride, such as at least one of HF, diluted HF, $CF_4$, or other gas comprising fluoride. In some embodiments, third fluoride residue from the gas, such as $(NH_4)_2SiF_6$ or other residual material comprising fluoride, remains on the top surface of the substrate 102 after removing the third patterned photoresist 1202. In some embodiments, third polymer residue from at least one of the third photoresist 1102 or the third patterned photoresist 1202 remains on the top surface of the substrate 102 after removing the third patterned photoresist 1202.

Figure 15:
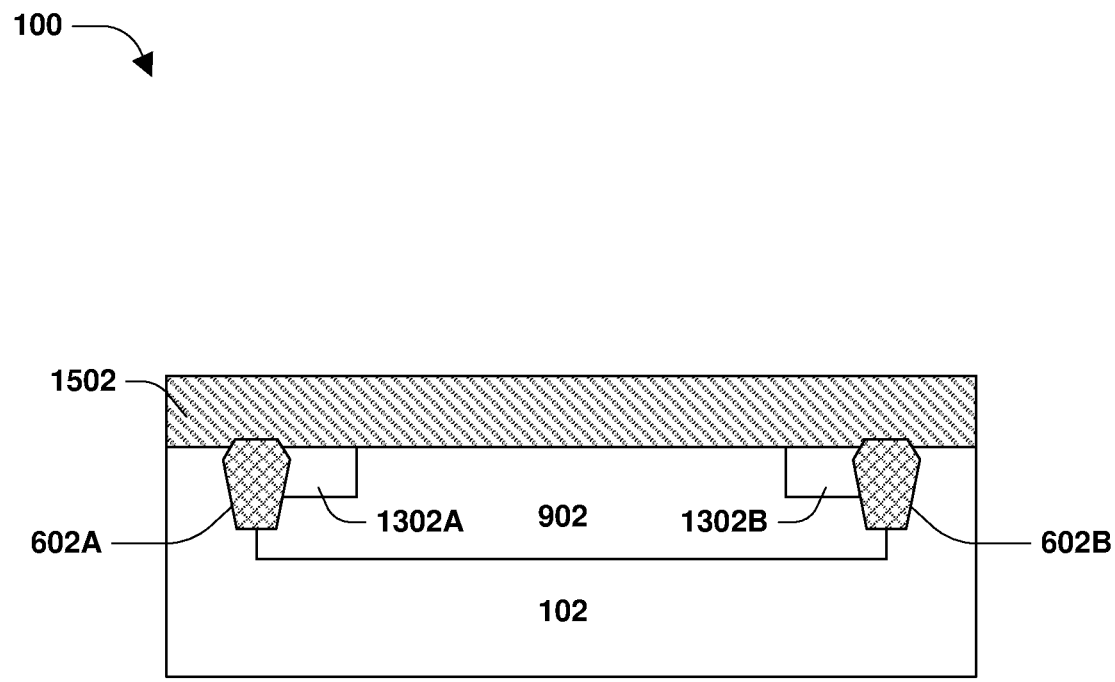

FIG. 15 illustrates a fourth photoresist 1502 formed over at least one of the substrate 102 or the isolation structures 602, according to some embodiments. The fourth photoresist 1502 at least one of overlies the substrate 102, is in direct contact with the top surface of the substrate 102, or is in indirect contact with the top surface of the substrate 102. The fourth photoresist 1502 at least one of overlies the isolation structures 602, is in direct contact with a top surface of an isolation structure 602, or is in indirect contact with a top surface of an isolation structure 602. The fourth photoresist 1502 is formed by at least one of PVD, sputtering, CVD, LPCVD, ALCVD, UHVCVD, RPCVD, ALD, MBE, LPE, spin on, growth, or other suitable techniques.

Figure 16:
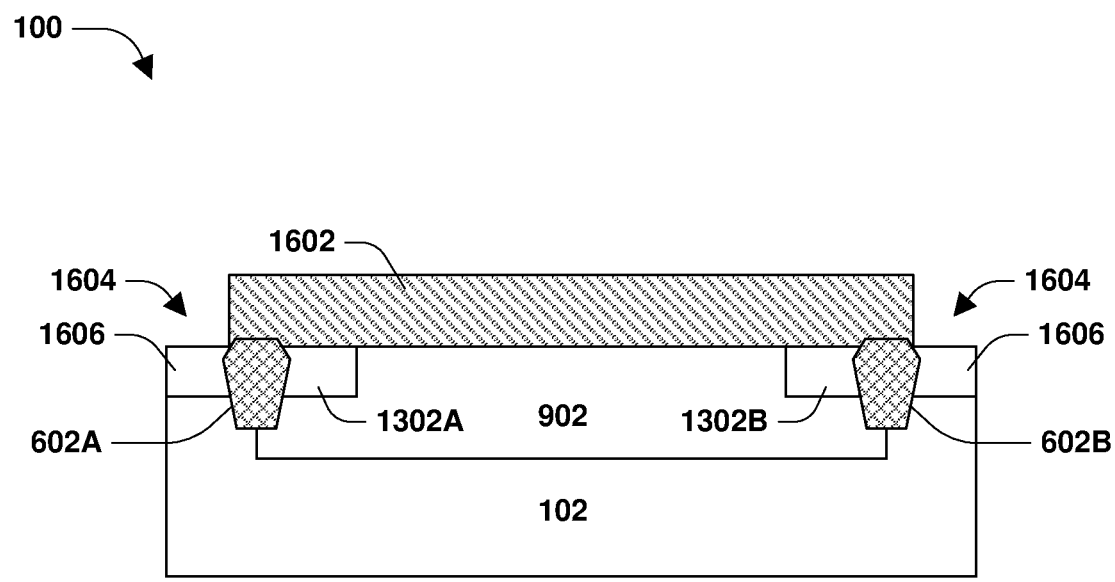

FIG. 16 illustrates a fourth patterned photoresist 1602 formed from the fourth photoresist 1502, according to some embodiments. The fourth patterned photoresist 1602 defines fourth openings 1604 exposing portions of the substrate 102. Even though two openings of the fourth openings 1604 of the fourth patterned photoresist 1602 are depicted, any number of openings of the fourth openings 1604 are contemplated. In some embodiments, the fourth openings 1604 do not overlie or are laterally offset from the isolation structures 602. In some embodiments, the fourth openings 1604 overlie at least some of the isolation structures 602.

Figure 17:
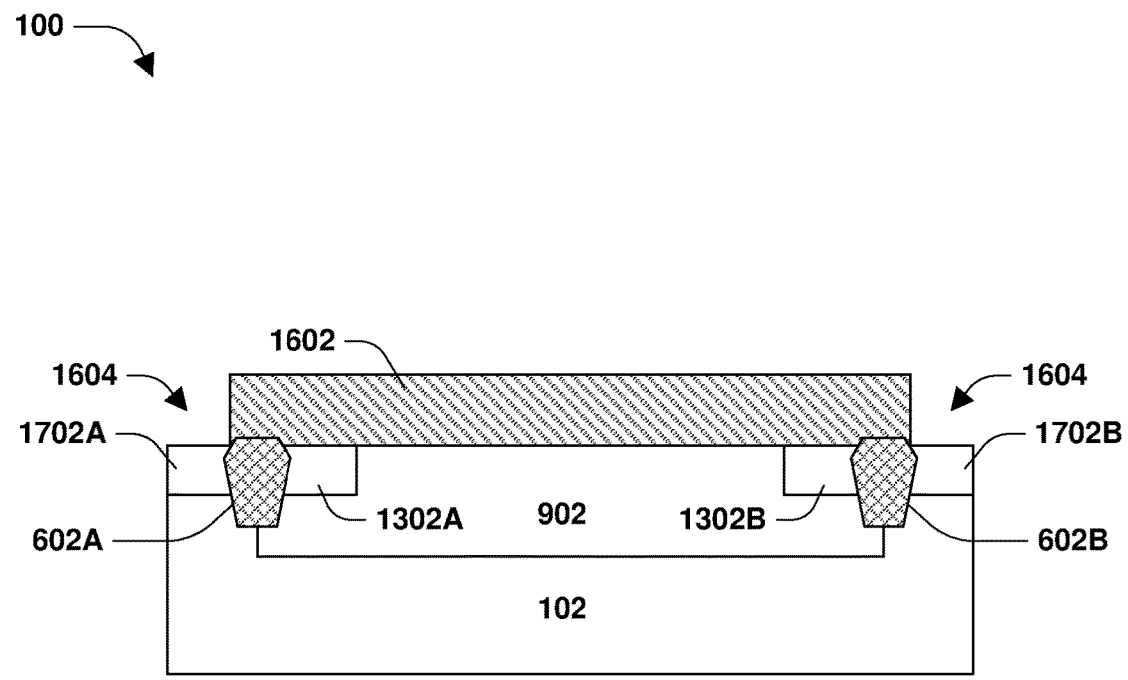

FIG. 17 illustrates use of the fourth patterned photoresist 1602 to dope one or more third portions 1606 of the substrate 102 (shown in FIG. 16) to form one or more third doped regions 1702, according to some embodiments. In some embodiments, the one or more third doped regions 1702 comprise at least one of a doped region 1702A or a doped region 1702B. In some embodiments, the first isolation structure 602A is between the doped region 1702A of the one or more third doped regions 1702 and the doped region 1702B of the one or more third doped regions 1702. In some embodiments, the first isolation structure 602A of the isolation structures 602 is between the doped region 1702A of the one or more third doped regions 1702 and the second isolation structure 602B of the isolation structures 602. Other configurations of the one or more third doped regions 1702 are within the scope of the present disclosure. The one or more third portions 1606 of the substrate 102 are doped to form the one or more third doped regions 1702 by at least one of ion implantation, molecular diffusion, or other suitable techniques. In some embodiments, a depth of dopants in the substrate 102 is controlled by increasing or decreasing a voltage used to direct the dopants into the substrate 102. Other processes and techniques for at least one of doping the one or more third portions 1606 of the substrate 102 or forming the one or more third doped regions 1702 are within the scope of the present disclosure. In some embodiments, the one or more third doped regions 1702 have a gradient such that a concentration of dopants changes, such as increases or decreases, as the one or more third doped regions 1702 extend into the substrate 102. In some embodiments, the one or more third doped regions 1702 comprise n-type dopants. In some embodiments, the one or more third doped regions 1702 comprise p-type dopants. Other configurations of the one or more third doped regions 1702 are within the scope of the present disclosure.

Figure 18:
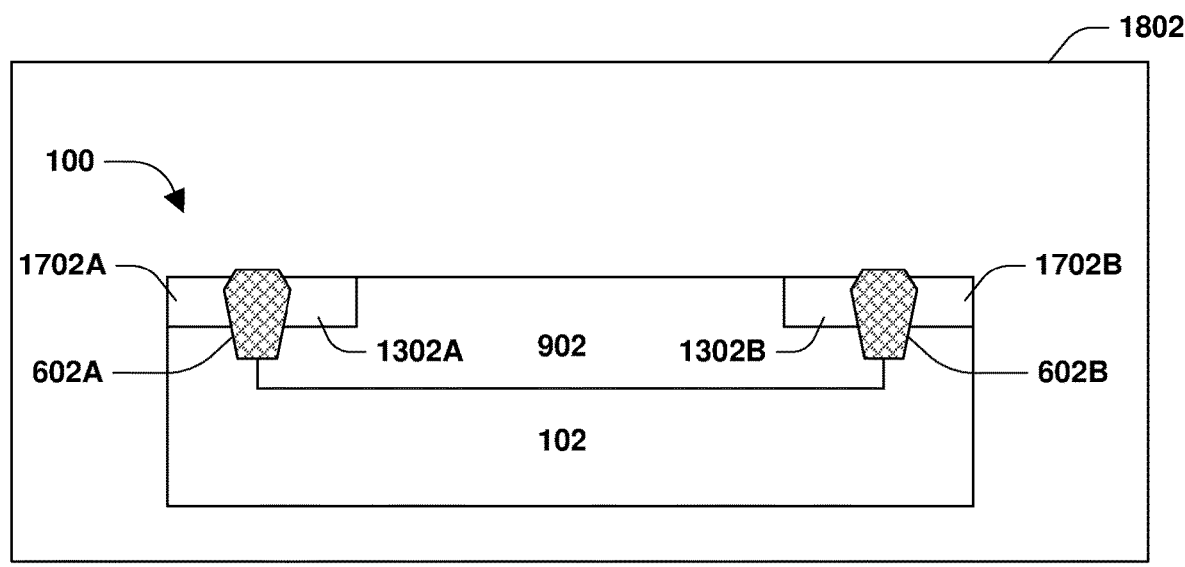

FIG. 18 illustrates removal of the fourth patterned photoresist 1602, according to some embodiments. The fourth patterned photoresist 1602 is removed after the one or more third portions 1606 of the substrate 102 are doped to form the one or more third doped regions 1702. The fourth patterned photoresist 1602 is removed by at least one of CMP, a washing process, or other suitable techniques. In some embodiments, the fourth patterned photoresist 1602 is removed using a gas comprising fluoride, such as at least one of HF, diluted HF, $CF_4$, or other gas comprising fluoride. In some embodiments, fourth fluoride residue from the gas, such as $(NH_4)_2SiF_6$ or other residual material comprising fluoride, remains on the top surface of the substrate 102 after removing the fourth patterned photoresist 1602. In some embodiments, fourth polymer residue from at least one of the fourth photoresist 1502 or the fourth patterned photoresist 1602 remains on the top surface of the substrate 102 after removing the fourth patterned photoresist 1602.

In some embodiments, the fourth patterned photoresist 1602 is removed in a first chamber 1802. In some embodiments, at least one of forming the first photoresist 202, forming the first patterned photoresist 302, forming the trenches 402, removing the first patterned photoresist 302, forming the isolation structures 602, forming the second photoresist 702, forming the second patterned photoresist 802, doping the first portion 806 of the substrate 102 to form the first doped region 902, removing the second patterned photoresist 802, forming the third photoresist 1102, forming the third patterned photoresist 1202, doping the one or more second portions 1206 of the substrate 102 to form the one or more second doped regions 1302, removing the third patterned photoresist 1202, forming the fourth photoresist 1502, forming the fourth patterned photoresist 1602, or doping the one or more third portions 1606 of the substrate 102 to form the one or more third doped regions 1702 are performed in the first chamber 1802.

Figure 19:
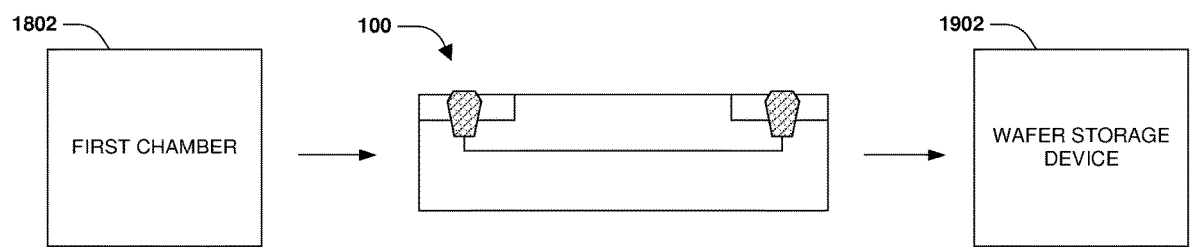
FIGS. 19-22 illustrate movement of a semiconductor arrangement during fabrication, in accordance with some embodiments.

FIG. 19 illustrates the semiconductor arrangement 100 transferred to a wafer storage device 1902. In some embodiments, the semiconductor arrangement 100 is transferred from the first chamber 1802 to the wafer storage device 1902 after removing the fourth patterned photoresist 1602. The wafer storage device 1902 is at least one of a wafer storage pod, such as a front-opening unified pod (FOUP), or other suitable storage device. In some embodiments, one or more wafers, such as a batch of wafers, are temporarily stored in at least one of the wafer storage device 1902 or other wafer storage devices during intervals between different processes, such as at least one of etching processes, ashing processes, stripping processes, metal plating processes, CMP processes, deposition processes, etc. The semiconductor arrangement 100 is in a wafer of the one or more wafers. In some embodiments, the one or more wafers are stacked vertically in the wafer storage device 1902 and supported by support frames having multiple separate wafer shelves or slots within the wafer storage device 1902. In some embodiments, at least one of humidity or contamination within the wafer storage device 1902 are controlled to maintain the integrity of the wafers in the wafer storage device 1902.

Figure 20:
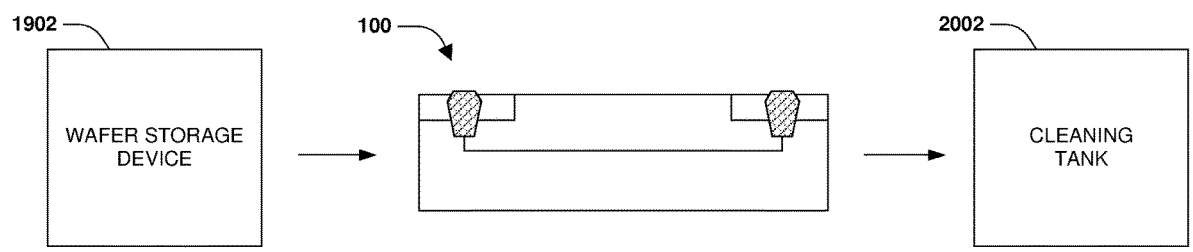

FIG. 20 illustrates the semiconductor arrangement 100 transferred to a cleaning tank 2002, according to some embodiments. In some embodiments, the semiconductor arrangement 100 is transferred from the wafer storage device 1902 to the cleaning tank 2002. At least some of the substrate 102, such as at least one of the top surface of the substrate 102 or one or more other surfaces of the substrate 102, is cleaned in the cleaning tank 2002. In some embodiments, the substrate 102 is cleaned with a liquid, such as deionized water or other suitable material. The substrate 102 is cleaned to at least one of remove or reduce polymer content on the substrate 102, such as on at least one of the top surface of the substrate 102 or one or more other surfaces of the substrate. The polymer content comprises at least one of the first polymer residue from at least one of the first photoresist 202 or the first patterned photoresist 302, the second polymer residue from at least one of the second photoresist 702 or the second patterned photoresist 802, the third polymer residue from at least one of the third photoresist 1102 or the third patterned photoresist 1202, or the fourth polymer residue from at least one of the fourth photoresist 1502 or the fourth patterned photoresist 1602.

Figure 21:
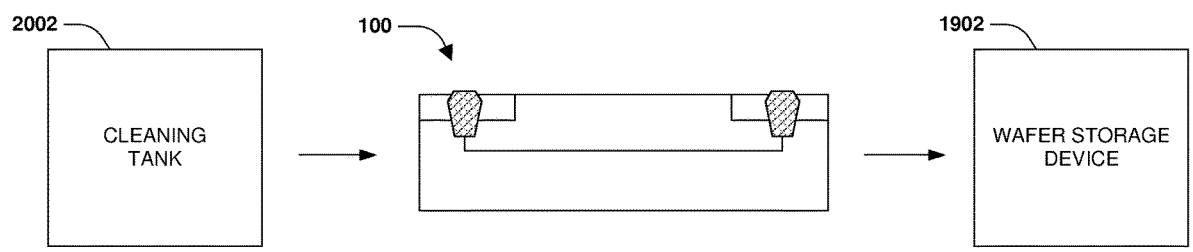

FIG. 21 illustrates the semiconductor arrangement 100 transferred to the wafer storage device 1902, according to some embodiments. In some embodiments, the semiconductor arrangement 100 is transferred from the cleaning tank 2002 to the wafer storage device 1902 after cleaning at least some of the substrate 102 in the cleaning tank 2002.

In some embodiments, at least some of the substrate 102, such as at least one of the top surface of the substrate 102 or one or more other surfaces of the substrate 102, is etched using an etching process. The etching process is at least one of a dry etching process, a wet etching process, an anisotropic etching process, an isotropic etching process, or other suitable process. The etching process uses at least one of HF, diluted HF, a chlorine compound such as $HCl_2$, $H_2S$, $CF_4$, or other suitable material. The etching process is performed to at least one of remove or reduce negative oxides on the substrate 102, such as on at least one of the top surface of the substrate 102 or one or more other surfaces of the substrate. In some embodiments, the etching process is performed after at least one of cleaning the semiconductor arrangement 100 or transferring the semiconductor arrangement 100 to the wafer storage device 1902. In some embodiments, the semiconductor arrangement 100 is transferred from the wafer storage device 1902 to a chamber, such as at least one of the first chamber 1802 or other chamber, and the etching process is performed in the chamber. The semiconductor arrangement 100 is transferred from the chamber to the wafer storage device 1902 after performing the etching process.

Figure 22:
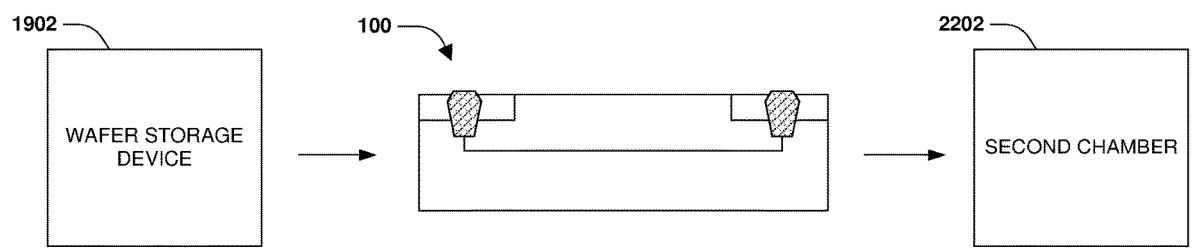

FIG. 22 illustrates the semiconductor arrangement 100 transferred to a second chamber 2202, according to some embodiments. In some embodiments, the second chamber 2202 is different than the first chamber 1802. In some embodiments, the second chamber 2202 is the same as the first chamber 1802. The semiconductor arrangement 100 is transferred from the wafer storage device 1902 to the second chamber 2202, such as after performing the etching process to at least one of remove or reduce negative oxides on the substrate 102.

Figure 23:
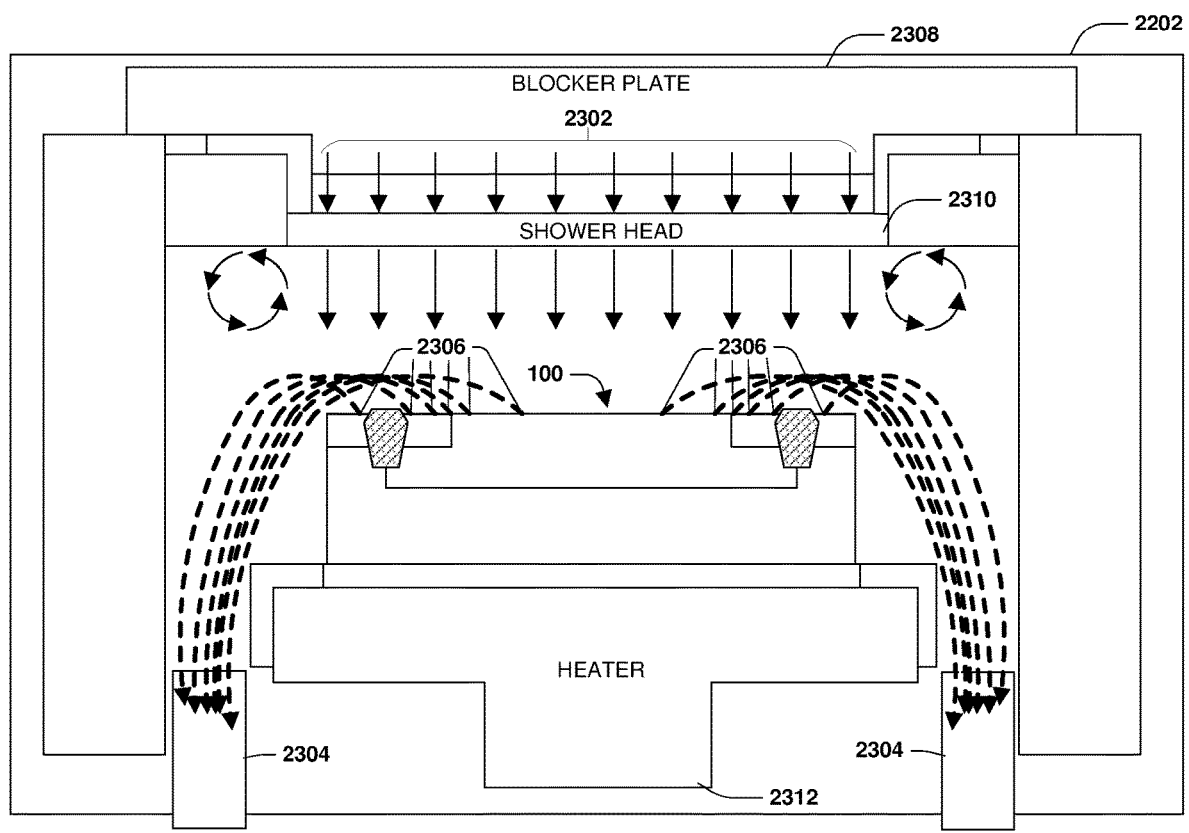
FIG. 23 illustrates treatment of a semiconductor arrangement in a chamber, in accordance with some embodiments.

FIG. 23 illustrates the semiconductor arrangement 100 being treated with a treating material 2302 in the second chamber 2202, according to some embodiments. In some embodiments, the semiconductor arrangement 100 is treated with the treating material 2302 to at least one of remove or reduce fluoride content 2306 on the substrate 102, such as at least one of on the top surface of the substrate 102 or one or more other surfaces of the substrate 102. The fluoride content 2306 comprises at least one of the first fluoride residue from the gas used to remove the first patterned photoresist 302, the second fluoride residue from the gas used to remove the second patterned photoresist 802, the third fluoride residue from the gas used to remove the third patterned photoresist 1202, or the fourth fluoride residue from the gas used to remove the fourth patterned photoresist 1602. In some embodiments, the fluoride content 2306 comprises fluoride ions. In some embodiments, the semiconductor arrangement 100 is heated using a heater 2312 while the semiconductor arrangement 100 is being treated with the treating material 2302.

The treating material 2302 comprises at least one of nitrous oxide or other suitable material. In FIG. 23, movement of the treating material 2302 is shown with arrows having solid lines and movement of the fluoride content 2306 is shown with arrows having dashed lines. In some embodiments, the treating material 2302 is pumped into the second chamber 2202. In some embodiments, the treating material 2302 is delivered to the semiconductor arrangement 100 via at least one of a blocker plate 2308 or a shower head 2310. In some embodiments, the blocker plate 2308 provides for uniform deposition or flow of the treating material 2302 through the shower head 2310 for delivery to the semiconductor arrangement 100. In some embodiments, the treating material 2302 flows through at least one of the blocker plate 2308 or the shower head 2310 and impinges on the semiconductor arrangement 100.

In some embodiments, impingement of the treating material 2302 on the semiconductor arrangement 100 removes the fluoride content 2306 from at least some of the substrate 102, such as at least one of on the top surface of the substrate 102 or one or more other surfaces of the substrate. The treating material 2302 collides with the fluoride content 2306 to remove the fluoride content 2306 from at least some of the substrate 102, such as at least one of on the top surface of the substrate 102 or one or more other surfaces of the substrate. In some embodiments, the fluoride content 2306 is removed from the second chamber 2202 using one or more exhausts 2304. In some embodiments, the one or more exhausts 2304 conduct the fluoride content 2306 from the second chamber 2202 to outside the second chamber 2202.

In some embodiments, a concentration of the fluoride content 2306 is greater on the side regions of the top surface of the substrate 102 than on the center of the top surface of the substrate 102. In some embodiments, more of the treating material 2302 is directed toward the side regions of the top surface of the substrate 102, such as by a configuration of apertures, etc. in at least one of the blocker plate 2308 or the shower head 2310, so as to interact to a greater degree with the fluoride content 2306 on side regions of the top surface of the substrate 102 than on the center of the top surface of the substrate 102.

In some embodiments, impingement of the treating material 2302 on the semiconductor arrangement 100 causes formation of a thin film on the top surface of the substrate 102. In some embodiments, the thin film comprises dangling bonds of atoms of the treating material 2302. In some embodiments where at least one of the treating material 2302 comprises nitrous oxide or the substrate comprises silicon, the thin film comprises dangling bonds of at least one of nitrogen, oxygen, or silicon. In some embodiments, the thin film comprises $SiO_xN_y$. The thin film has a thickness between about 1 nanometer and about 3 nanometers. Other values of the thickness are within the scope of the present disclosure. The thin film inhibits accumulation of contaminants, such as at least one of fluoride ions or other contaminants, on the top surface of the substrate 102.

Figure 24:
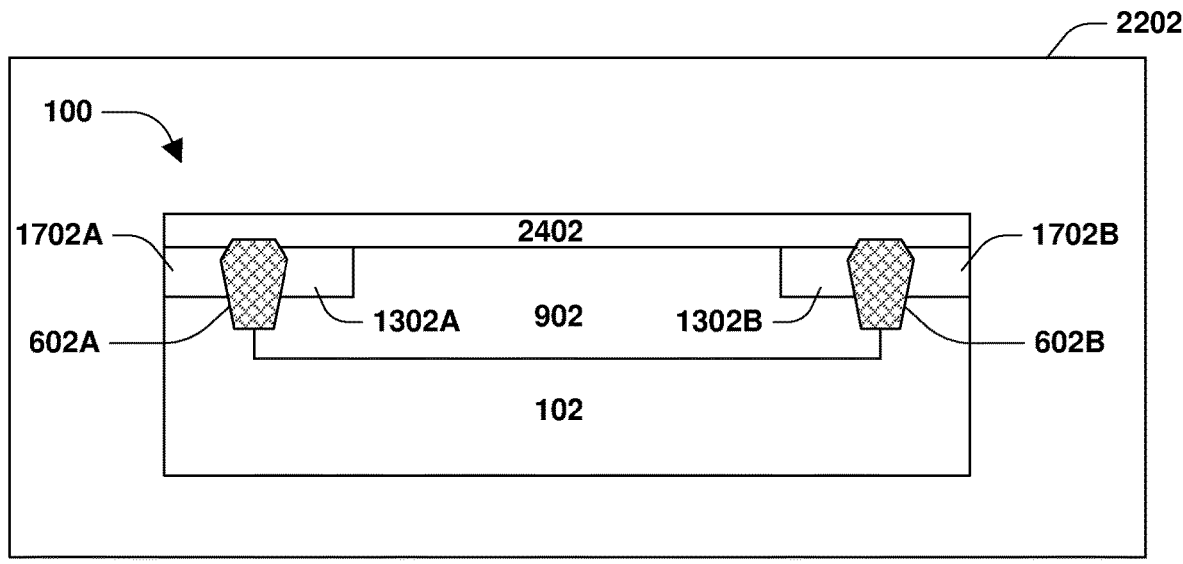
FIG. 24 illustrates a cross-sectional view of a semiconductor arrangement during fabrication, in accordance with some embodiments.

FIG. 24 illustrates a first dielectric layer 2402 formed over at least one of the substrate 102 or the isolation structures 602, according to some embodiments. The first dielectric layer 2402 at least one of overlies the substrate 102, is in direct contact with the top surface of the substrate 102, or is in indirect contact with the top surface of the substrate 102. In some embodiments, the thin film is between the first dielectric layer 2402 and the substrate 102. The first dielectric layer 2402 at least one of overlies the isolation structures 602, is in direct contact with a top surface of an isolation structure 602, or is in indirect contact with a top surface of an isolation structure 602. The first dielectric layer 2402 is formed by at least one of PVD, sputtering, CVD, LPCVD, ALCVD, UHVCVD, RPCVD, ALD, MBE, LPE, spin on, growth, or other suitable techniques. In some embodiments, the first dielectric layer 2402 is a resist protective oxide (RPO) layer. In some embodiments, the first dielectric layer 2402 comprises at least one of oxide or other suitable material.

In some embodiments, the first dielectric layer 2402 is formed in the second chamber 2202. The first dielectric layer 2402 is formed in the second chamber 2202 after treating the substrate 102 with the treating material 2302. In some embodiments, the first dielectric layer 2402 is formed in a chamber different than the second chamber 2202, such as the first chamber 1802 or other chamber.

Figure 25:
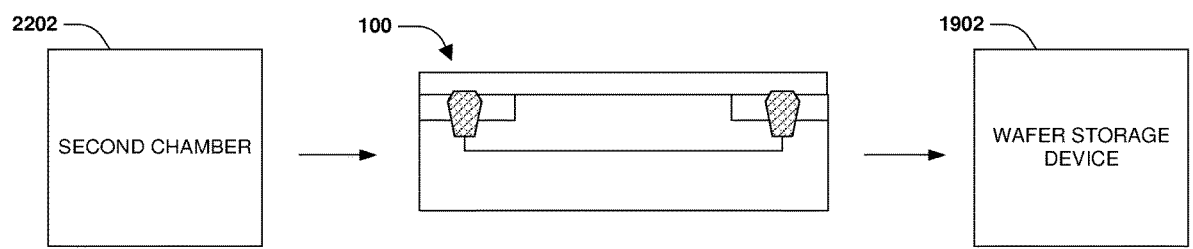
FIG. 25 illustrates movement of a semiconductor arrangement during fabrication, in accordance with some embodiments.

FIG. 25 illustrates the semiconductor arrangement 100 transferred to the wafer storage device 1902, according to some embodiments. In some embodiments where the first dielectric layer 2402 is formed in the second chamber 2202, the semiconductor arrangement 100 is transferred from the second chamber 2202 to the wafer storage device 1902 after forming the first dielectric layer 2402. In some embodiments where the first dielectric layer 2402 is formed in a chamber different than the second chamber 2202, the semiconductor arrangement 100 is transferred from the chamber to the wafer storage device 1902 after forming the first dielectric layer 2402.

Figure 26:
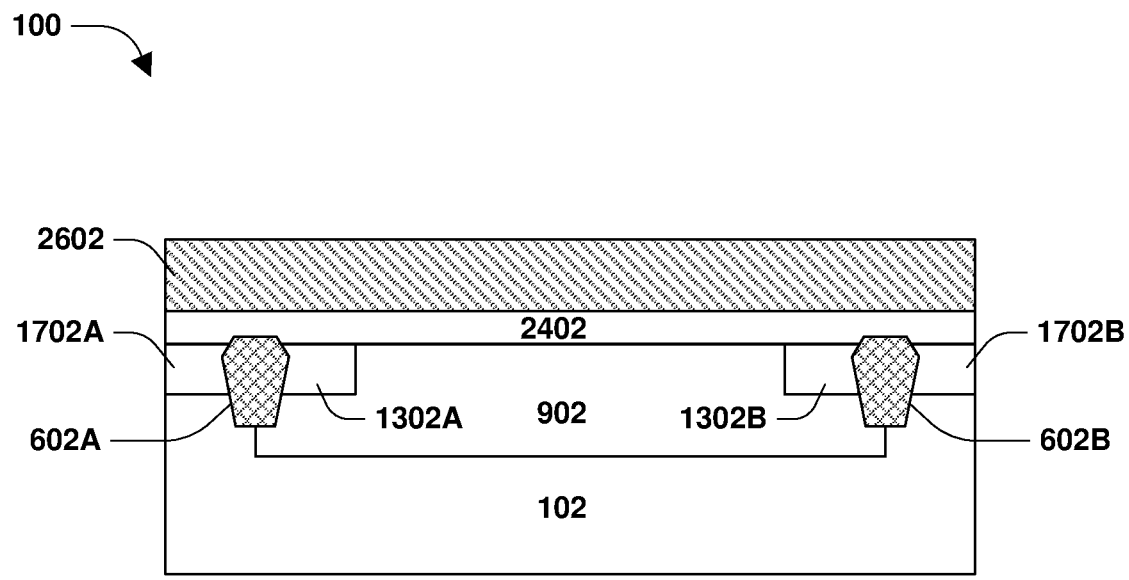
FIGS. 26-34 illustrate cross-sectional views of a semiconductor arrangement at various stages of fabrication, in accordance with some embodiments

FIG. 26 illustrates a fifth photoresist 2602 formed over the first dielectric layer 2402, according to some embodiments. The fifth photoresist 2602 at least one of overlies the first dielectric layer 2402, is in direct contact with a top surface of the first dielectric layer 2402, or is in indirect contact with the top surface of the first dielectric layer 2402. The fifth photoresist 2602 is formed by at least one of PVD, sputtering, CVD, LPCVD, ALCVD, UHVCVD, RPCVD, ALD, MBE, LPE, spin on, growth, or other suitable techniques.

Figure 27:
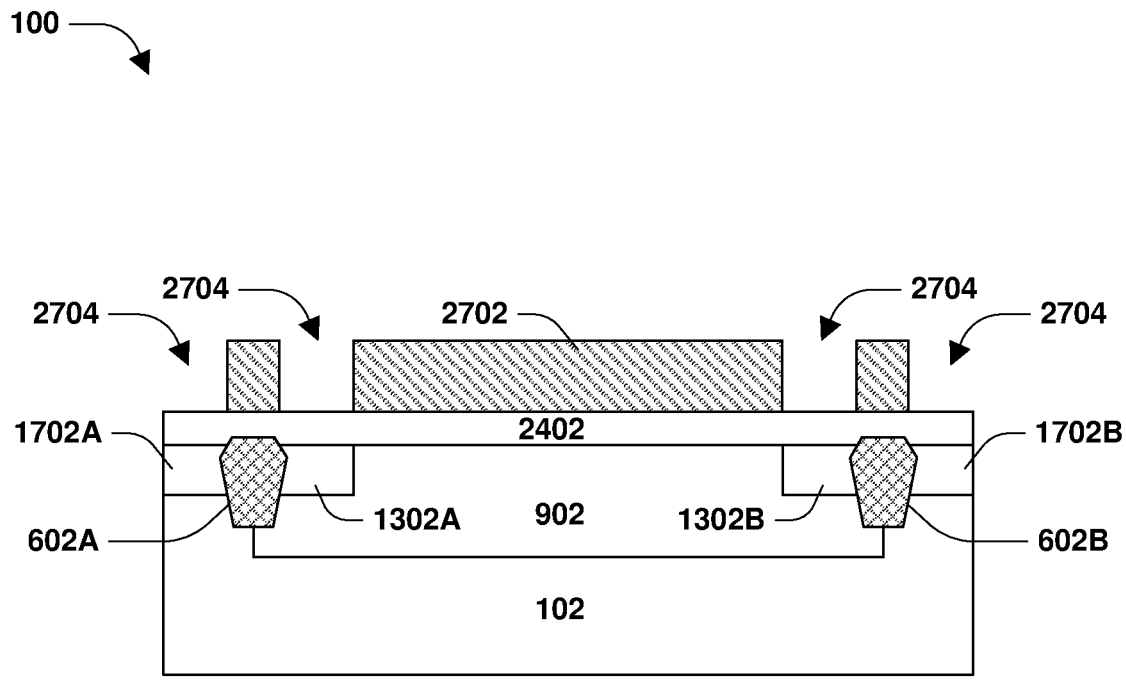

FIG. 27 illustrates a fifth patterned photoresist 2702 formed from the fifth photoresist 2602, according to some embodiments. The fifth patterned photoresist 2702 defines fifth openings 2704 exposing portions of the first dielectric layer 2402. Even though four openings of the fifth openings 2704 of the fifth patterned photoresist 2702 are depicted, any number of openings of the fifth openings 2704 are contemplated. In some embodiments, the fifth openings 2704 overlie doped regions of at least one of the one or more second doped regions 1302 or the one or more third doped regions 1702.

Figure 28:
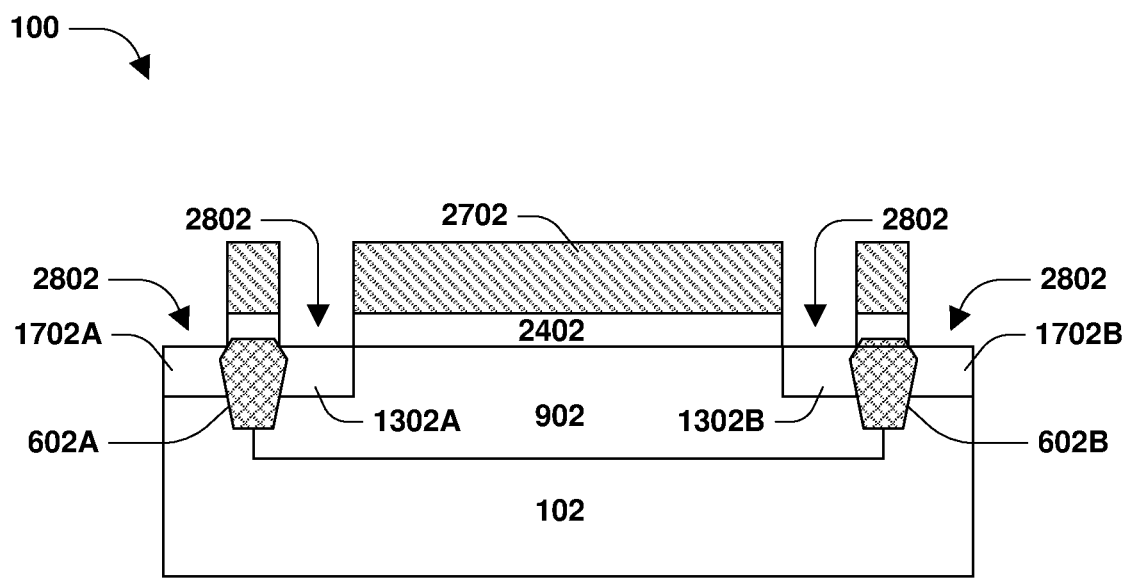

FIG. 28 illustrates use of the fifth patterned photoresist 2702 to form one or more sixth openings 2802 in the first dielectric layer 2402, according to some embodiments. In some embodiments, the one or more sixth openings 2802 expose the top surface of the substrate 102. A portion of the first dielectric layer 2402 is removed to form an opening of the one or more sixth openings 2802. The one or more sixth openings 2802 overlie doped regions of at least one of the one or more second doped regions 1302 or the one or more third doped regions 1702. In some embodiments, the one or more sixth openings 2802 expose doped regions of at least one of the one or more second doped regions 1302 or the one or more third doped regions 1702. Other processes and techniques for forming the one or more sixth openings 2802 are within the scope of the present disclosure.

Figure 29:
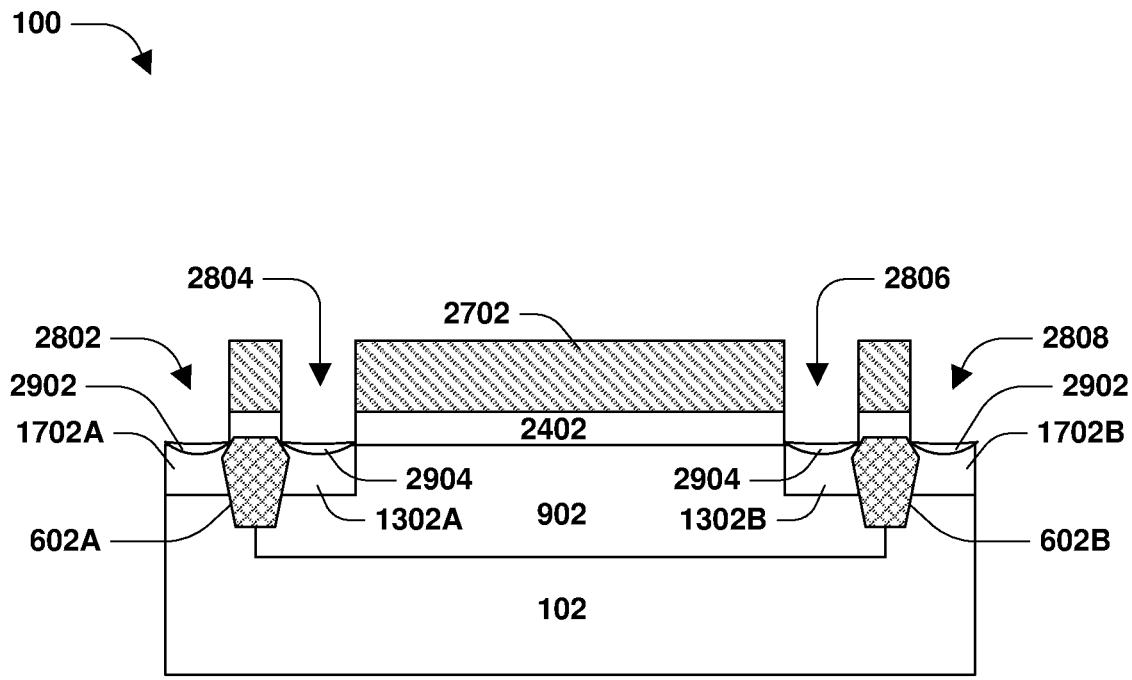

FIG. 29 illustrates one or more first components 2904 and one or more second components 2902 formed on the substrate 102, according to some embodiments. In some embodiments, the one or more first components 2904 overlie the one or more second doped regions 1302. A component of the one or more first components 2904 is at least one of on or in a doped region of the one or more second doped regions 1302. In some embodiments, the one or more first components 2904 comprise at least one of silicide components, salicide components, or other suitable material. Other configurations and structures of the one or more first components 2904 are within the scope of the present disclosure.

In some embodiments, the one or more first components 2904 are formed by at least forming metal over the one or more second doped regions 1302 and heating the semiconductor arrangement 100 after forming the metal. Other processes and techniques for forming the one or more first components 2904 are within the scope of the present disclosure.

In some embodiments, the one or more second components 2902 overlie the one or more third doped regions 1702. A component of the one or more second components 2902 is at least one of on or in a doped region of the one or more third doped regions 1702. In some embodiments, the one or more second components 2902 comprise at least one of silicide components, salicide components, or other suitable material. Other configurations and structures of the one or more second components 2902 are within the scope of the present disclosure.

In some embodiments, the one or more second components 2902 are formed by forming metal over the one or more third doped regions 1702 and heating the semiconductor arrangement 100 after forming the metal. Other processes and techniques for forming the one or more second components 2902 are within the scope of the present disclosure.

Figure 30:
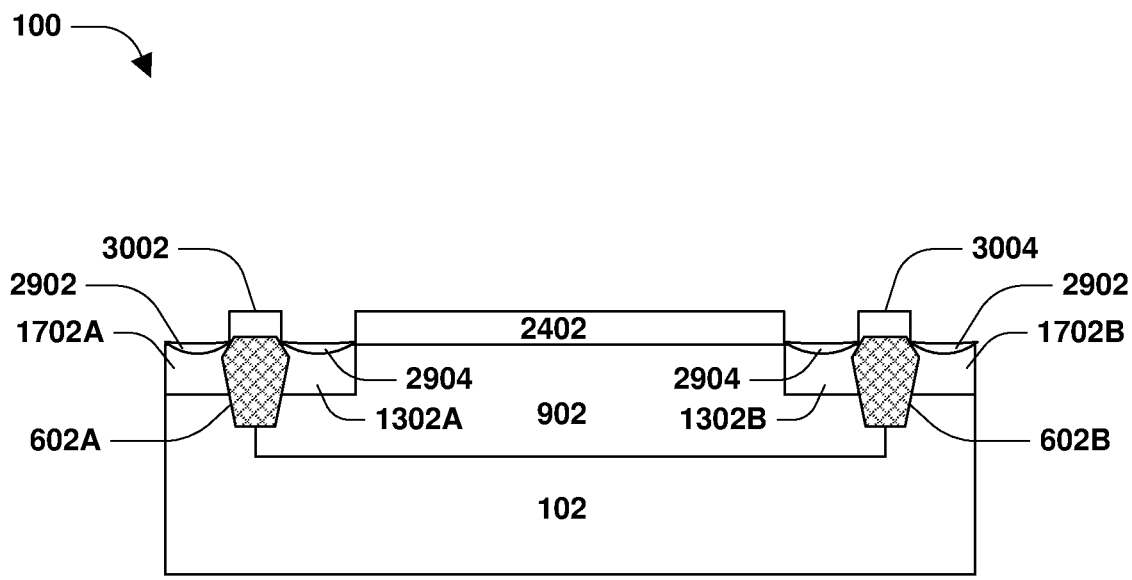

FIG. 30 illustrates removal of the fifth patterned photoresist 2702, according to some embodiments. In some embodiments, the fifth patterned photoresist 2702 is removed after the one or more first components 2904 and the one or more second components 2902 are formed. The fifth patterned photoresist 2702 is removed by at least one of CMP, a washing process, or other suitable techniques.

Figure 31:
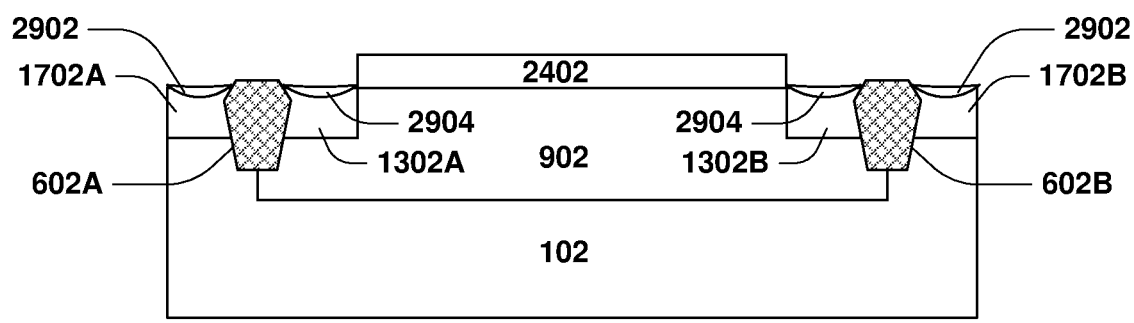

FIG. 31 illustrates removal of at least one of a first portion 3002 of the first dielectric layer 2402 (shown in FIG. 30) or a second portion 3004 of the first dielectric layer 2402 (shown in FIG. 30), according to some embodiments. In some embodiments, at least one of the first portion 3002 of the first dielectric layer 2402 or the second portion 3004 of the first dielectric layer 2402 are removed by at least one of CMP, etching, or other suitable techniques.

Figure 32:
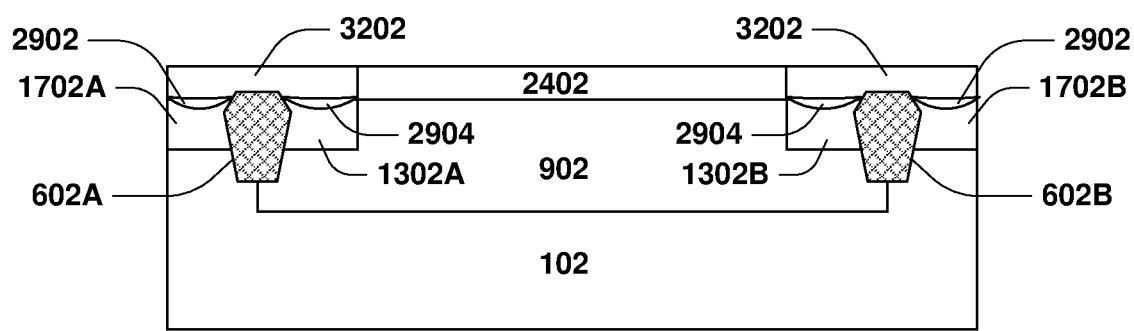

FIG. 32 illustrates a second dielectric layer 3202 formed over the substrate 102, according to some embodiments. In some embodiments, the second dielectric layer 3202 at least one of overlies the substrate 102, is in direct contact with the top surface of the substrate 102, or is in indirect contact with the top surface of the substrate 102. In some embodiments, the second dielectric layer 3202 at least one of overlies the isolation structures 602, is in direct contact with a top surface of an isolation structure 602, or is in indirect contact with a top surface of an isolation structure 602. In some embodiments, the second dielectric layer 3202 at least one of overlies the one or more first components 2904, is in direct contact with a top surface of a component of the one or more first components 2904, or is in indirect contact with a top surface of a component of the one or more first components 2904. In some embodiments, the second dielectric layer 3202 at least one of overlies the one or more second components 2902, is in direct contact with a top surface of a component of the one or more second components 2902, or is in indirect contact with a top surface of a component of the one or more second components 2902. In some embodiments, the first dielectric layer 2402 is between a first portion of the second dielectric layer 3202 and a second portion of the second dielectric layer 3202. The second dielectric layer 3202 comprises at least one of silicon, nitride, oxide, such as $SiO_2$, or other suitable material. The second dielectric layer 3202 is formed by at least one of PVD, sputtering, CVD, LPCVD, ALCVD, UHVCVD, RPCVD, ALD, MBE, LPE, spin on, growth, or other suitable techniques. In some embodiments, the second dielectric layer 3202 is an interlevel dielectric (ILD).

Figure 33:
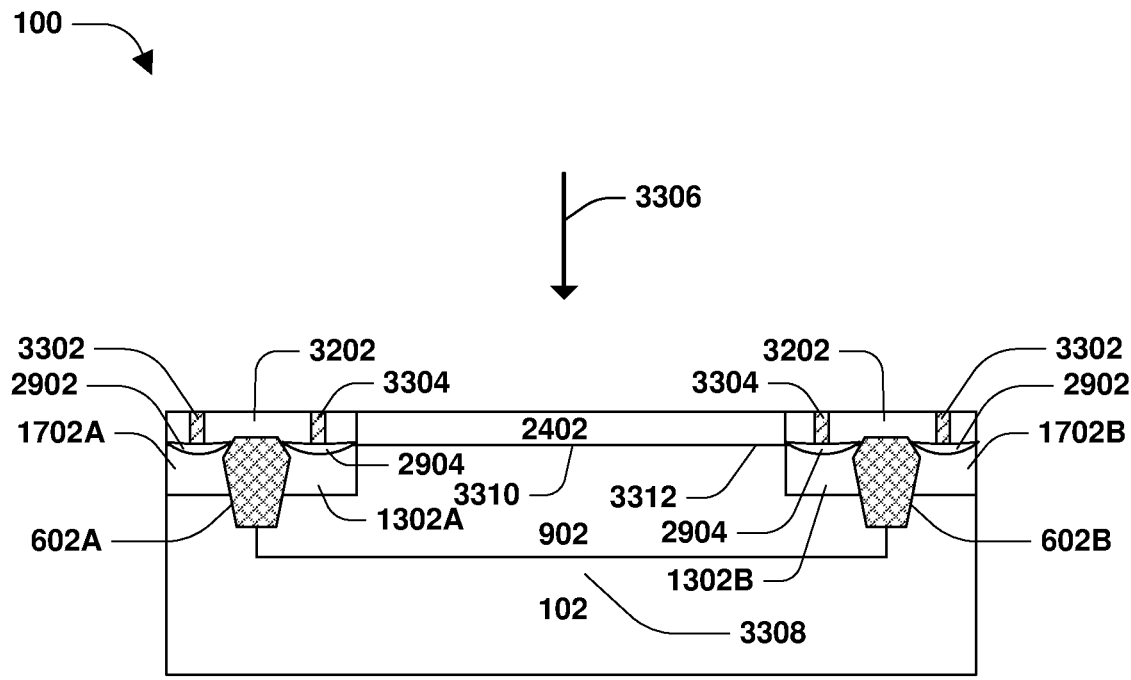

FIG. 33 illustrates one or more first conductive structures 3304 and one or more second conductive structures 3302 formed in the second dielectric layer 3202, according to some embodiments. In some embodiments, the one or more first conductive structures 3304 are formed by forming one or more openings (not shown) in the second dielectric layer 3202 and forming the one or more first conductive structures 3304 in the one or more openings. The one or more first conductive structures 3304 are formed by at least one of PVD, sputtering, CVD, LPCVD, ALCVD, UHVCVD, RPCVD, ALD, MBE, LPE, spin on, growth, or other suitable techniques. Other processes and techniques for forming the one or more first conductive structures 3304 are within the scope of the present disclosure.

In some embodiments, a conductive structure of the one or more first conductive structures 3304 at least one of overlies a component of the one or more first components 2904, is in direct contact with a top surface of the component of the one or more first components 2904, or is in indirect contact with the top surface of the component of the one or more first components 2904. The one or more first conductive structures 3304 comprise a conductive material, such as a metal material, or other suitable material. Even though two conductive structures of the one or more first conductive structures 3304 are depicted, any number of conductive structures of the one or more first conductive structures 3304 are contemplated. In some embodiments, the one or more first conductive structures 3304 are at least one of one or more metal contacts, one or more metal pads, one or more vias, or one or more metal terminals. In some embodiments, the one or more first conductive structures 3304 are connected to at least one of various doped features, circuitry, input/output, etc. of the semiconductor arrangement 100. Other structures and configurations of the one or more first conductive structures 3304 are within the scope of the present disclosure.

In some embodiments, the one or more second conductive structures 3302 are formed by forming one or more openings (not shown) in the second dielectric layer 3202 and forming the one or more second conductive structures 3302 in the one or more openings. The one or more second conductive structures 3302 are formed by at least one of PVD, sputtering, CVD, LPCVD, ALCVD, UHVCVD, RPCVD, ALD, MBE, LPE, spin on, growth, or other suitable techniques. Other processes and techniques for forming the one or more second conductive structures 3302 are within the scope of the present disclosure.

In some embodiments, a conductive structure of the one or more second conductive structures 3302 at least one of overlies a component of the one or more second components 2902, is in direct contact with a top surface of the component of the one or more second components 2902, or is in indirect contact with the top surface of the component of the one or more second components 2902. The one or more second conductive structures 3302 comprise a conductive material, such as a metal material, or other suitable material. Even though two conductive structures of the one or more second conductive structures 3302 are depicted, any number of conductive structures of the one or more second conductive structures 3302 are contemplated. In some embodiments, the one or more second conductive structures 3302 are at least one of one or more metal contacts, one or more metal pads, one or more vias, or one or more metal terminals. In some embodiments, the second conductive structures 3302 are connected to at least one of various doped features, circuitry, input/output, etc. of the semiconductor arrangement 100. Other structures and configurations of the one or more second conductive structures 3302 are within the scope of the present disclosure.

In some embodiments, the semiconductor arrangement 100 is configured to at least one of sense radiation, detect the radiation, or convert the radiation to electrons. In some embodiments, at least some of the radiation travels, such as in a direction 3306, towards the semiconductor arrangement 100. In some embodiments, at least some of the radiation travels through at least some of the first dielectric layer 2402 or at least some of the substrate 102. In some embodiments, at least some of the radiation traveling through the substrate 102, such as through the first doped region 902, is converted to electrons by the substrate 102. In some embodiments, at least some of the radiation is converted to electrons at a junction between the first doped region 902 and a portion 3308 of the substrate 102 adjacent the first doped region 902. In some embodiments, the portion 3308 of the substrate 102 is at least one of separate from the first doped region 902 or a non-doped region of the substrate 102. In some embodiments, a measure of the radiation, such as an amplitude of ambient light, is determined by determining electrical properties, such as at least one of a current or a voltage, in or at least one of the one or more first conductive structures 3304 or the one or more second conductive structures 3302.

Contaminants between the substrate 102 and the first dielectric layer 2402, such as fluoride ions in an interface defined between the substrate 102 and the first dielectric layer 2402, affect performance of the semiconductor arrangement 100. In some embodiments, higher amounts of the fluoride ions in the interface cause lower amounts of the radiation to be at least one of sensed, detected, or converted to electrons by the semiconductor arrangement 100. In some embodiments, the fluoride ions introduce a charge, such as a negative charge, in the interface. In some embodiments, the charge at least one of decreases sensitivity of the junction between the first doped region 902 and the portion 3308 of the substrate 102, or causes lower amounts of the radiation to be at least one of sensed, detected, or converted to electrons at the junction.

Treating the substrate 102 with the treating material 2302 prior to forming the first dielectric layer 2402 provides for a reduction in contaminants at the interface between the substrate 102 and the first dielectric layer 2402, as compared with some semiconductor arrangements formed without treating a substrate prior to forming a dielectric layer over the substrate. In some embodiments, treating the substrate 102 with the treating material 2302 prior to forming the first dielectric layer 2402 provides for a reduction, for example a reduction of about 24%, in at least one of an intensity of fluoride ions or an amount of fluoride ions at the interface between the substrate 102 and the first dielectric layer 2402, as compared with some semiconductor arrangements formed without treating a substrate prior to forming a dielectric layer over the substrate 102. In some embodiments, treating the substrate 102 with the treating material 2302 prior to forming the first dielectric layer 2402 provides for a reduction, for example a reduction of about 63%, in a difference between an amount of fluoride ions in a center region 3310 of the interface and an amount of fluoride ions in a side region 3312 of the interface, as compared with some semiconductor arrangements formed without treating a substrate prior to forming a dielectric layer over the substrate 102. In some embodiments, treating the substrate 102 with the treating material 2302 prior to forming the first dielectric layer 2402 provides for an increase in an amount of radiation that is at least one of sensed, detected, or converted by the semiconductor arrangement 100, as compared with some semiconductor arrangements formed without treating a substrate prior to forming a dielectric layer over the substrate. In some embodiments, treating the substrate 102 with the treating material 2302 prior to forming the first dielectric layer 2402 provides for an increased amount of nitrogen at the interface between the substrate 102 and the first dielectric layer 2402, as compared with some semiconductor arrangements formed without treating a substrate prior to forming a dielectric layer over the substrate 102. In some embodiments, treating the substrate 102 with the treating material 2302 prior to forming the first dielectric layer 2402 provides for an increased ratio of nitrogen intensity to fluoride intensity at the interface between the substrate 102 and the first dielectric layer 2402, as compared with some semiconductor arrangements formed without treating a substrate prior to forming a dielectric layer over the substrate. In some embodiments, by treating the substrate 102 with the treating material 2302 prior to forming the first dielectric layer 2402, a ratio of nitrogen intensity to fluoride intensity at the interface between the substrate 102 and the first dielectric layer 2402 is between about 10 and about 11. Some semiconductor arrangements formed without treating a substrate prior to forming a dielectric layer over the substrate have a ratio of nitrogen intensity to fluoride intensity at an interface between the dielectric layer and the substrate of between about 3 and about 4.

In some embodiments, treating the substrate 102 with the treating material 2302 prior to forming the first dielectric layer 2402 provides for improved optical performance of the semiconductor arrangement 100, such as at least one of an improved quantum efficiency of the semiconductor arrangement 100 or an improved photosensitivity of the semiconductor arrangement 100, as compared with some semiconductor arrangements formed without treating a substrate prior to forming a dielectric layer over the substrate. Treating the substrate 102 with the treating material 2302 prior to forming the first dielectric layer 2402 reduces contaminants, such as fluoride ions, in the interface between the substrate 102 and the first dielectric layer 2402, and thus increases sensitivity of the junction between the first doped region 902 and the portion 3308 of the substrate 102 and improves the quantum efficiency of the semiconductor arrangement 100 such as by causing higher amounts of radiation to be at least one of sensed, detected, or converted to electrons at the junction by reducing the contaminants in the interface between the substrate 102 and the first dielectric layer 2402.

In some embodiments, treating the substrate 102 with the treating material 2302 prior to forming the first dielectric layer 2402 provides for improved photosensitivity of the semiconductor arrangement 100, as compared with some semiconductor arrangements formed without treating a substrate prior to forming a dielectric layer over the substrate. In some embodiments, treating the substrate 102 with the treating material 2302 prior to forming the first dielectric layer 2402 provides for an increase of about 3.6% in photosensitivity of the semiconductor arrangement 100 to blue light, such as having wavelengths between about 430 nanometers and about 510 nanometers, as compared with some semiconductor arrangements formed without treating a substrate prior to forming a dielectric layer over the substrate. In some embodiments, treating the substrate 102 with the treating material 2302 prior to forming the first dielectric layer 2402 provides for an increase of about 7% in photosensitivity of the semiconductor arrangement 100 to red light, such as having wavelengths between about 620 nanometers and about 720 nanometers, as compared with some semiconductor arrangements formed without treating a substrate prior to forming a dielectric layer over the substrate. In some embodiments, treating the substrate 102 with the treating material 2302 prior to forming the first dielectric layer 2402 provides for an increase of about 7.9% in photosensitivity of the semiconductor arrangement 100 to infrared radiation, such as having wavelengths greater than about 750 nanometers, as compared with some semiconductor arrangements formed without treating a substrate prior to forming a dielectric layer over the substrate. In some embodiments, treating the substrate 102 with the treating material 2302 prior to forming the first dielectric layer 2402 provides for an increase of about 3.6% in an amount of blue light, such as having wavelengths between about 430 nanometers and about 510 nanometers, that is at least one of sensed, detected, or converted by the semiconductor arrangement 100, as compared with some semiconductor arrangements formed without treating a substrate prior to forming a dielectric layer over the substrate. In some embodiments, treating the substrate 102 with the treating material 2302 prior to forming the first dielectric layer 2402 provides for an increase of about 7% in an amount of red light, such as having wavelengths between about 620 nanometers and about 720 nanometers, that is at least one of sensed, detected, or converted by the semiconductor arrangement 100, as compared with some semiconductor arrangements formed without treating a substrate prior to forming a dielectric layer over the substrate. In some embodiments, treating the substrate 102 with the treating material 2302 prior to forming the first dielectric layer 2402 provides for an increase of about 7.9% in an amount of infrared radiation, such as having wavelengths greater than about 750 nanometers, that is at least one of sensed, detected, or converted by the semiconductor arrangement 100, as compared with some semiconductor arrangements formed without treating a substrate prior to forming a dielectric layer over the substrate.

In some processes for forming a semiconductor arrangement, a substrate is not treated with a treating material prior to forming a dielectric layer over the substrate. Different processes are performed on the substrate to form doped regions, such as at least one of the first doped region 902, the one or more second doped regions 1302, or the one or more third doped regions 1702. The substrate is stored in a wafer storage device during intervals between the different processes. Fluoride residue from the different processes remain on a surface of the substrate after the different processes are performed. The substrate is transferred to the wafer storage device after the different processes are performed. While the substrate is stored in the wafer storage device, chemicals, such as fluoride ions, are outgassed from the substrate and adhere to interior surfaces of the wafer storage device. The substrate is transferred from the wafer storage device to a cleaning tank. The substrate is cleaned in the cleaning tank. Rather than transferring the substrate back to the wafer storage device, the substrate is transferred to a cleaned wafer storage device different than the wafer storage device. The cleaned wafer storage device is cleaned before the substrate is transferred to the cleaned wafer storage device to reduce an amount of fluoride content in the cleaned wafer storage device. The substrate is transferred from the cleaned wafer storage device to a chamber and an etching process is performed to remove negative oxides from one or more surfaces of the negative oxides. After performing the etching process, the substrate is transferred from the chamber to the cleaned wafer storage device. The cleaned wafer storage device comprises fluoride ions after being cleaned, and fluoride ions from the cleaned wafer storage device accumulate on one or more surfaces of the substrate while the substrate is stored in the cleaned wafer storage device. Accordingly, a longer duration of time that the substrate is stored in the cleaned wafer storage device corresponds to a greater amount of fluoride content that accumulates on one or more surfaces of the substrate. The substrate is transferred to a chamber, and a dielectric layer, such as the first dielectric layer 2402, is formed over the substrate. A wafer comprising the substrate and the dielectric layer are transferred to a different wafer storage device different than the cleaned wafer storage device. The cleaned wafer storage device is cleaned again and used to store a different substrate after the different substrate undergoes the different processes and is cleaned in the cleaning tank.

In some embodiments, prior to transferring the substrate 102 to the second chamber 2202, the substrate 102 is stored in the wafer storage device 1902. In some embodiments, the substrate 102 is not transferred to a different wafer storage device, such as a cleaned storage device, after cleaning the substrate 102 in the cleaning tank 2002. In some embodiments, because the substrate 102 is treated with the treating material 2302 prior to forming the first dielectric layer 2402, a duration of time that the substrate 102 is stored in the wafer storage device 1902 prior to transferring the substrate 102 to the second chamber 2202 has little to no influence an amount of fluoride ions in the interface between the substrate 102 and the first dielectric layer 2402.

Figure 34:
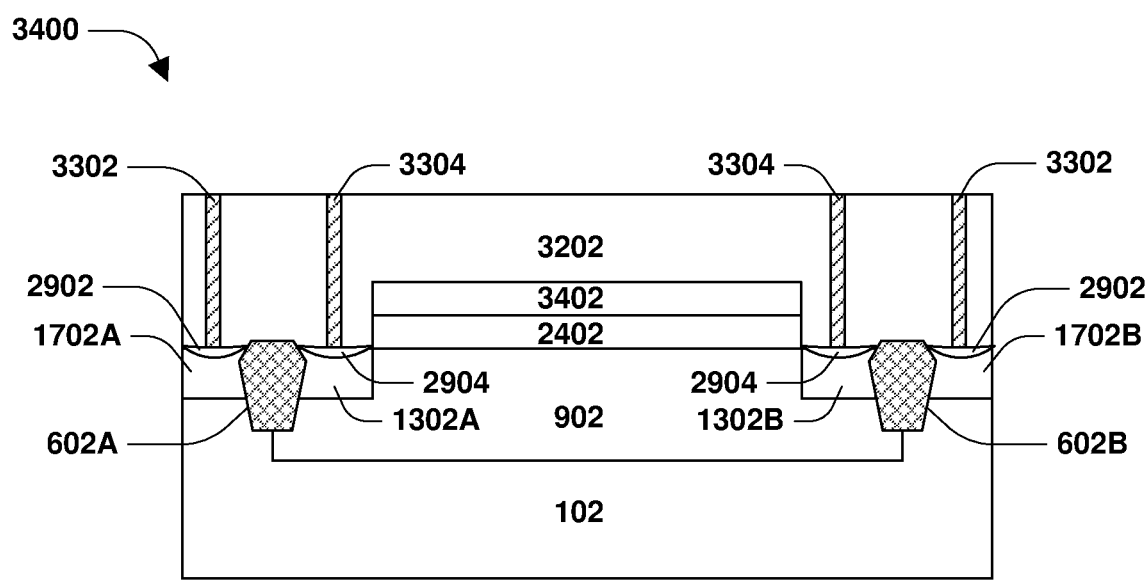

FIG. 34 illustrates a cross-sectional view of a semiconductor arrangement 3400, according to some embodiments. The semiconductor arrangement 3400 comprises at least some elements, structures, layers, features, etc. of the semiconductor arrangement 100. The semiconductor arrangement 3400 comprises a third dielectric layer 3402. The third dielectric layer 3402 at least one of overlies the first dielectric layer 2402, is in direct contact with the first dielectric layer 2402, or is in indirect contact with the first dielectric layer 2402. The third dielectric layer 3402 at least one of underlies the second dielectric layer 3202, is in direct contact with the second dielectric layer 3202, or is in indirect contact with the second dielectric layer 3202. The third dielectric layer 3402 comprises at least one of silicon, oxide, nitride, such as silicon nitride, or other suitable material. In some embodiments, the third dielectric layer 3402 is a contact etch stop layer (CESL).

Figure 35:
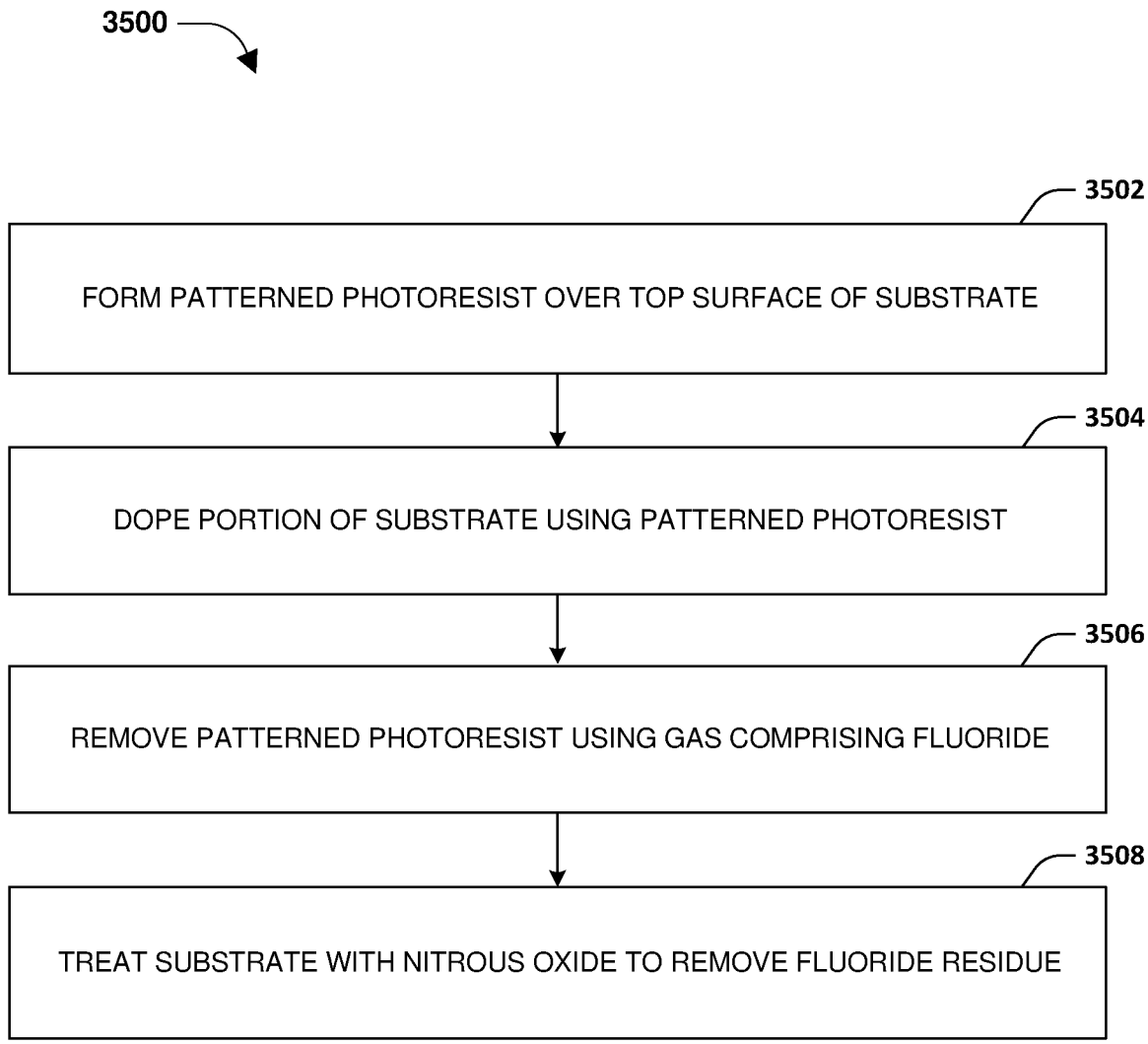
FIG. 35 is a flow diagram illustrating a method of forming a semiconductor arrangement, in accordance with some embodiments.

A method 3500 of forming a semiconductor arrangement, such as at least one of the semiconductor arrangement 100, the semiconductor arrangement 3400, or other suitable semiconductor arrangement, is illustrated in FIG. 35, in accordance with some embodiments. At 3502, a patterned photoresist is formed over a top surface of a substrate. The patterned photoresist is at least one of the second patterned photoresist 802, the third patterned photoresist 1202, the fourth patterned photoresist 1602, or other suitable patterned photoresist. The substrate is at least one of the substrate 102 or other suitable substrate. At 3504, a portion of the substrate is doped using the patterned photoresist. The portion is at least one of the first portion 806, a portion of the one or more second portions 1206, a portion of the one or more third portions 1606, or other suitable portion. At 3506, the patterned photoresist is removed using a gas comprising fluoride. Fluoride residue from the gas remains on the top surface of the substrate after removing the patterned photoresist. The fluoride residue comprises at least one of the fluoride content 2306 or other fluoride residue. At 3508, the substrate is treated with nitrous oxide to remove the fluoride residue.

Figure 36:
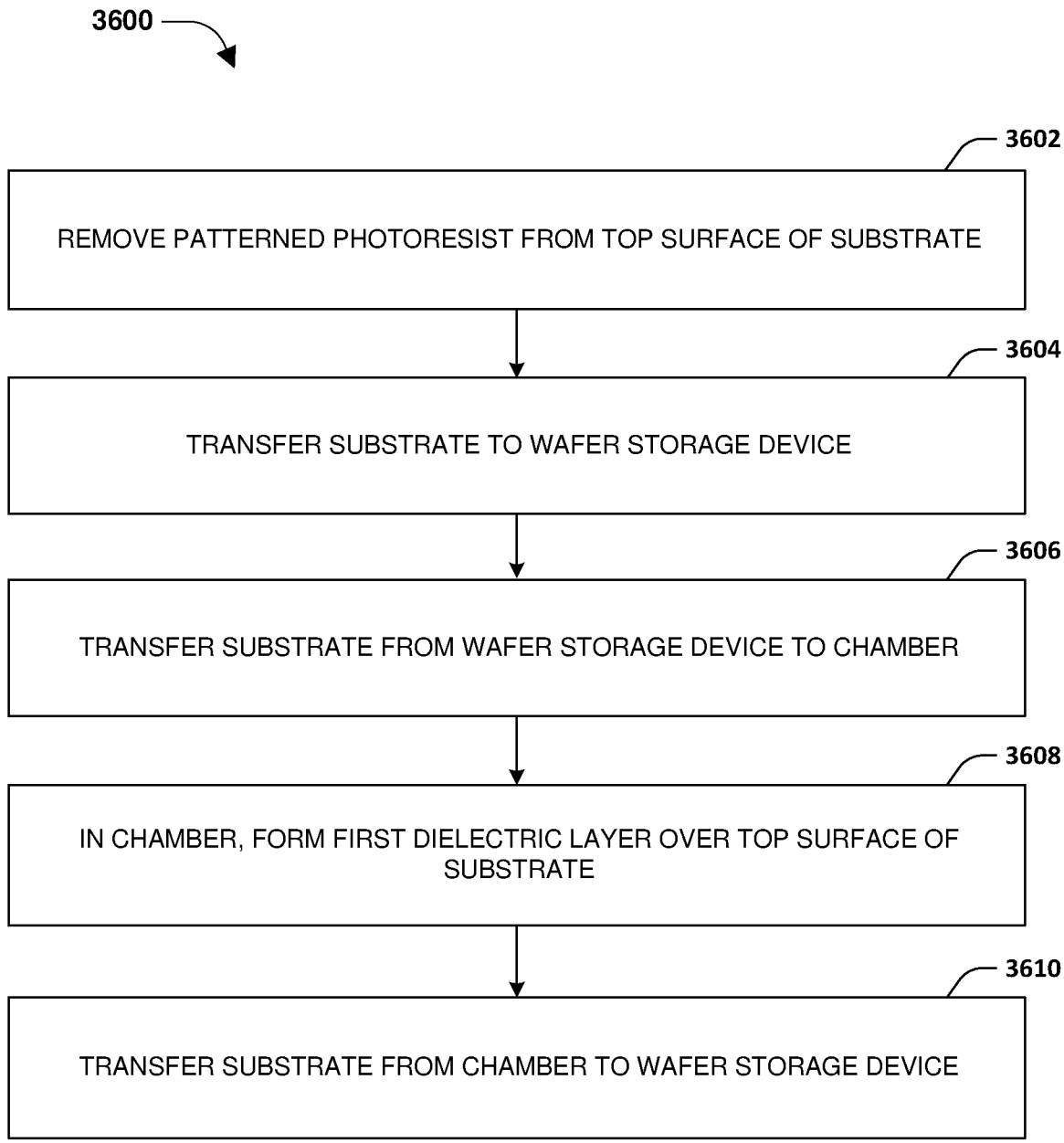
FIG. 36 is a flow diagram illustrating a method of forming a semiconductor arrangement, in accordance with some embodiments.

A method 3600 of forming a semiconductor arrangement, such as at least one of the semiconductor arrangement 100, the semiconductor arrangement 3400, or other suitable semiconductor arrangement, is illustrated in FIG. 36, in accordance with some embodiments. At 3602, a patterned photoresist is removed from a top surface of a substrate. The patterned photoresist is at least one of the first patterned photoresist 302, the second patterned photoresist 802, the third patterned photoresist 1202, the fourth patterned photoresist 1602, or other suitable patterned photoresist. The substrate is at least one of the substrate 102 or other suitable substrate. At 3604, the substrate is transferred to a wafer storage device, such as at least one of the wafer storage device 1902 or other suitable wafer storage device. At 3606, the substrate is transferred from the wafer storage device to a chamber, such as at least one of the second chamber 2202 or other suitable chamber. At 3608, in the chamber, a first dielectric layer is formed over the top surface of the substrate. The first dielectric layer is at least one of the first dielectric layer 2402 or other suitable dielectric layer. At 3610, the substrate is transferred from the chamber to the wafer storage device.

Figure 37:
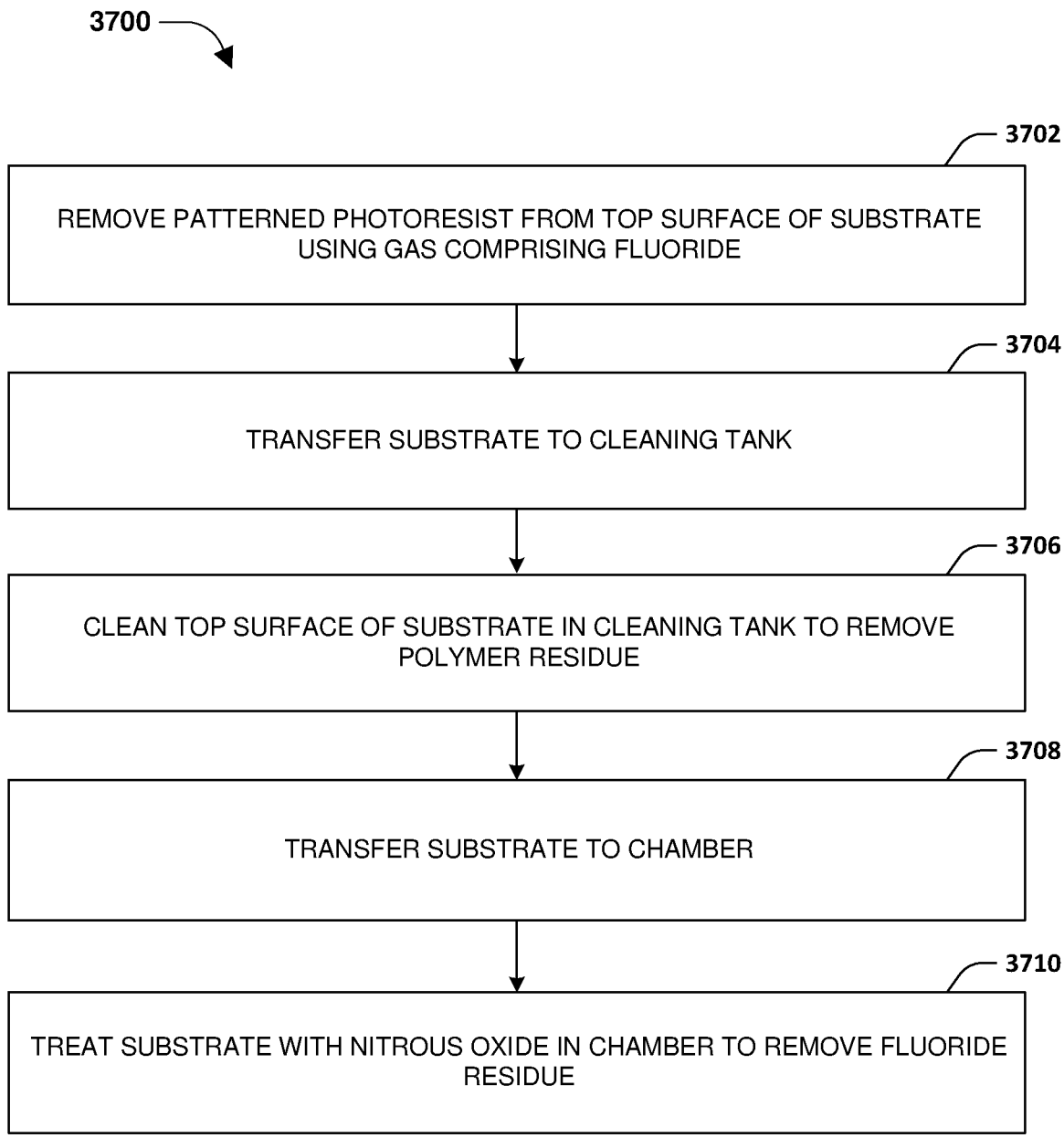
FIG. 37 is a flow diagram illustrating a method of forming a semiconductor arrangement, in accordance with some embodiments.

A method 3700 of forming a semiconductor arrangement, such as at least one of the semiconductor arrangement 100, the semiconductor arrangement 3400, or other suitable semiconductor arrangement, is illustrated in FIG. 37, in accordance with some embodiments. At 3702, a patterned photoresist is removed from a top surface of a substrate using a gas comprising fluoride. The patterned photoresist is at least one of the first patterned photoresist 302, the second patterned photoresist 802, the third patterned photoresist 1202, the fourth patterned photoresist 1602, or other suitable patterned photoresist. The substrate is at least one of the substrate 102 or other suitable substrate. Polymer residue from the patterned photoresist remains on the top surface of the substrate after removing the patterned photoresist. Fluoride residue from the gas remains on the top surface of the substrate after removing the patterned photoresist. The fluoride residue comprises at least one of the fluoride content 2306 or other fluoride residue. At 3704, the substrate is transferred to a cleaning tank, such as at least one of the cleaning tank 2002 or other suitable cleaning tank. At 3706, the top surface of the substrate is cleaned in the cleaning tank to remove the polymer residue. At 3708, the substrate is transferred to a chamber, such as at least one of the second chamber 2202 or other suitable chamber. At 3710, the substrate is treated with nitrous oxide in the chamber to remove the fluoride residue.

Figure 38:
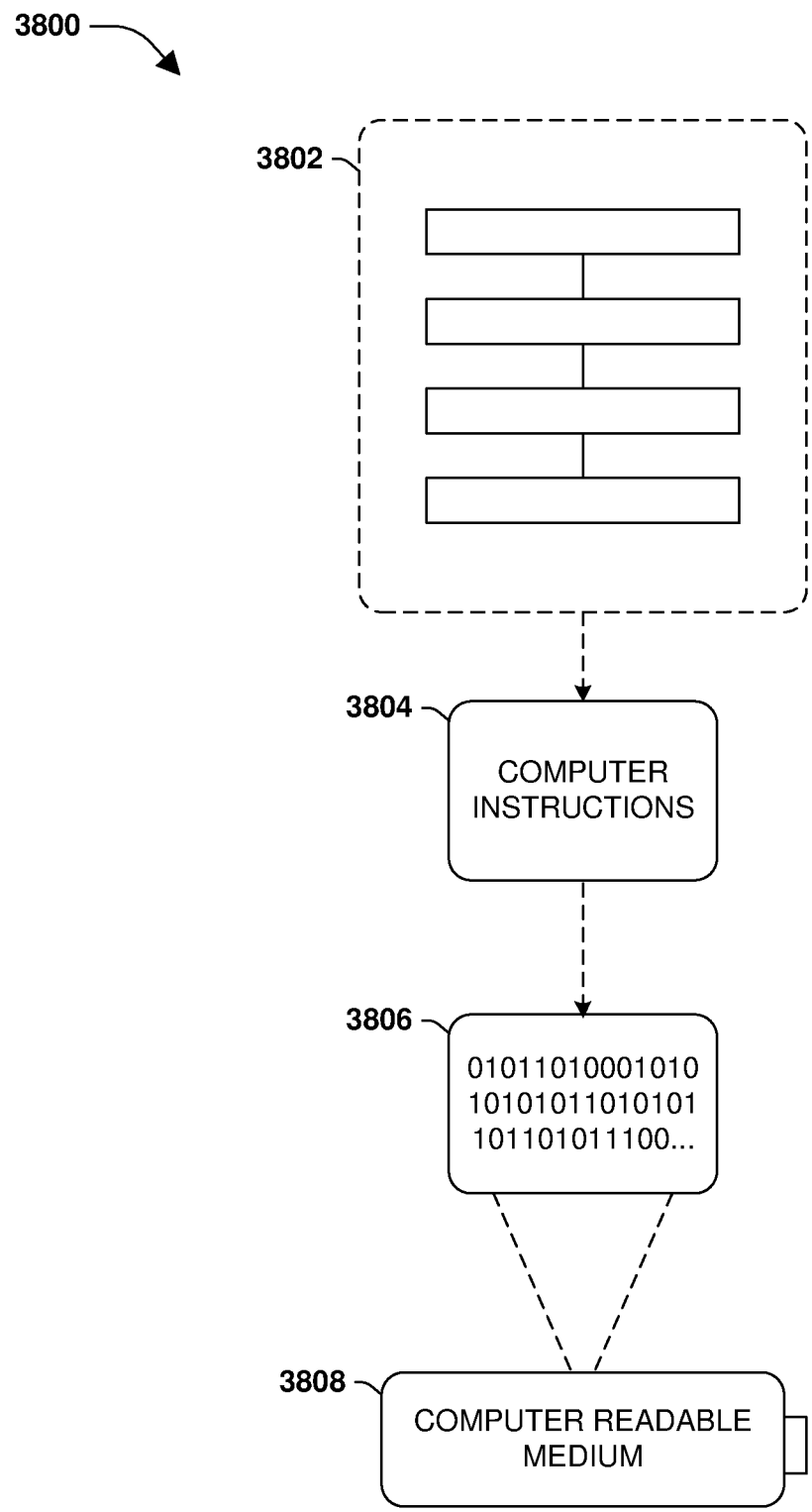
FIG. 38 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 38, wherein the embodiment 3800 comprises a computer-readable medium 3808 (e.g., a CD-R, DVD-R, flash drive, a platter of a hard disk drive, etc.), on which is encoded computer-readable data 3806. This computer-readable data 3806 in turn comprises a set of processor-executable computer instructions 3804 configured to operate according to one or more of the principles set forth herein. In some embodiments 3800, the processor-executable computer instructions 3804 are configured to perform a method 3802, such as at least some of the aforementioned method(s). In some embodiments, the processor-executable computer instructions 3804 are configured to implement a system, such as at least some of the one or more aforementioned system(s). Many such computer-readable media may be devised by those of ordinary skill in the art that are configured to operate in accordance with the techniques presented herein.

According to some embodiments, at least one of the one or more layers, features, structures, elements, etc. disclosed herein are in direct contact with another of the one or more layers, features, structures, elements, etc. disclosed herein. According to some embodiments, at least one of the one or more layers, features, structures, elements, etc. disclosed herein are not in direct contact with another of the one or more layers, features, structures, elements, etc. disclosed herein, such as where one or more intervening, separating, etc. layers, features, structures, elements, etc. exist.

In some embodiments, a method for forming a semiconductor arrangement is provided. The method includes forming a patterned photoresist over a top surface of a substrate. The method includes doping a first portion of the substrate using the patterned photoresist. The method includes removing the patterned photoresist using a gas comprising fluoride, wherein fluoride residue from the gas remains on the top surface of the substrate after removing the patterned photoresist. The method includes treating the substrate with nitrous oxide to remove the fluoride residue.

In some embodiments, a method for forming a semiconductor arrangement is provided. The method includes removing a patterned photoresist from a top surface of a substrate. The method includes transferring the substrate to a wafer storage device. The method includes transferring the substrate from the wafer storage device to a first chamber. The method includes forming, in the first chamber, a first dielectric layer over the top surface of the substrate. The method includes transferring the substrate from the first chamber to the wafer storage device.

In some embodiments, a method for forming a semiconductor arrangement is provided. The method includes removing a patterned photoresist from a top surface of a substrate using a gas comprising fluoride, wherein polymer residue from the patterned photoresist remains on the top surface of the substrate after removing the patterned photoresist, and fluoride residue from the gas remains on the top surface of the substrate after removing the patterned photoresist. The method includes transferring the substrate to a cleaning tank. The method includes cleaning the top surface of the substrate in the cleaning tank to remove the polymer residue. The method includes transferring the substrate to a chamber. The method includes treating the substrate with nitrous oxide in the chamber to remove the fluoride residue.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for forming a semiconductor arrangement, comprising:
    forming a patterned photoresist over a top surface of a substrate;
    doping a first portion of the substrate using the patterned photoresist;
    removing the patterned photoresist using a gas comprising fluoride, wherein fluoride residue from the gas remains on the top surface of the substrate after removing the patterned photoresist;
    cleaning the top surface of the substrate;
    etching the top surface of the substrate to remove negative oxides after cleaning the top surface of the substrate; and treating the substrate with nitrous oxide to remove the fluoride residue after etching the top surface of the substrate to remove the negative oxides.

2. The method of claim 1, comprising:
after treating the substrate with the nitrous oxide, forming a first dielectric layer over the top surface of the substrate.

3. The method of claim 1, wherein:
cleaning the top surface of the substrate comprises utilizing deionized water.

4. The method of claim 1, comprising:
prior to treating the substrate with the nitrous oxide, forming a first isolation structure and a second isolation structure in the substrate.

5. The method of claim 4, wherein:
the first portion of the substrate is between the first isolation structure and the second isolation structure.

6. The method of claim 4, wherein:
the first isolation structure is between the first portion of the substrate and the second isolation structure.

7. The method of claim 1, wherein:
treating the substrate with the nitrous oxide comprises pumping the nitrous oxide into a chamber comprising the substrate.

8. The method of claim 7, wherein:
treating the substrate with the nitrous oxide comprises removing the fluoride residue from the chamber using an exhaust.

9. A method for forming a semiconductor arrangement, comprising:
removing a patterned photoresist from a top surface of a substrate using a gas comprising fluoride, wherein:
polymer residue from the patterned photoresist remains on the top surface of the substrate after removing the patterned photoresist; and
fluoride residue from the gas remains on the top surface of the substrate after removing the patterned photoresist;
transferring the substrate to a cleaning tank;
cleaning the top surface of the substrate in the cleaning tank to remove the polymer residue;
etching the top surface of the substrate to remove negative oxides;
transferring the substrate to a chamber; and
treating the substrate with nitrous oxide in the chamber to remove the fluoride residue.

10. The method of claim 9, comprising:
after treating the substrate with the nitrous oxide, forming a first dielectric layer over the top surface of the substrate.

11. The method of claim 9, comprising:
after cleaning the top surface of the substrate and prior to transferring the substrate to the chamber, transferring the substrate from the cleaning tank to a wafer storage device.

12. The method of claim 11, wherein:
transferring the substrate to the chamber comprises transferring the substrate from the wafer storage device to the chamber.

13. The method of claim 12, comprising:
after treating the substrate with the nitrous oxide, transferring the substrate from the chamber to the wafer storage device.

14. A method for forming a semiconductor arrangement, comprising:
forming a patterned photoresist over a top surface of a substrate;
doping a first portion of the substrate using the patterned photoresist;
removing the patterned photoresist using a gas comprising fluoride, wherein fluoride residue from the gas remains on the top surface of the substrate after removing the patterned photoresist;
etching the top surface of the substrate to remove negative oxides; and
treating the substrate with nitrous oxide to remove the fluoride residue.

15. The method of claim 14, wherein:
treating the substrate with the nitrous oxide comprises treating the substrate with the nitrous oxide after etching the top surface of the substrate to remove the negative oxides.

16. The method of claim 14, comprising:
cleaning the top surface of the substrate to remove polymer residue after removing the patterned photoresist.

17. The method of claim 14, comprising:
heating the substrate concurrently with treating the substrate with the nitrous oxide.

18. The method of claim 14, wherein:
treating the substrate with nitrous oxide to remove the fluoride residue comprises applying a first concentration of the nitrous oxide to a side region of the top surface of the substrate and applying a second concentration of the nitrous oxide to a center region of the top surface of the substrate, and
the second concentration is different than the first concentration.

19. The method of claim 18, wherein:
the second concentration is less than the first concentration.

20. The method of claim 14, comprising:
after treating the substrate with the nitrous oxide, forming a first dielectric layer to contact the top surface of the substrate.

* * * * *